United States Patent
Zhou et al.

(10) Patent No.: US 7,144,848 B2
(45) Date of Patent: Dec. 5, 2006

(54) CLEANING COMPOSITIONS CONTAINING HYDROXYLAMINE DERIVATIVES AND PROCESSES USING SAME FOR RESIDUE REMOVAL

(75) Inventors: De-Ling Zhou, Sunnyvale, CA (US); Jing Qiao, Fremont, CA (US); Shihying Lee, Fremont, CA (US); Bakul P. Patel, Pleasanton, CA (US); Becky Min Hon, Milpitas, CA (US)

(73) Assignee: EKC Technology, Inc., Hayward, CA (US)

( * ) Notice: Subject to any disclaimer, the term of this patent is extended or adjusted under 35 U.S.C. 154(b) by 147 days.

(21) Appl. No.: 10/689,620

(22) Filed: Oct. 22, 2003

(65) Prior Publication Data
US 2004/0147420 A1 Jul. 29, 2004

Related U.S. Application Data

(63) Continuation-in-part of application No. 10/162,679, filed on Jun. 6, 2002, now Pat. No. 6,825,156, and a continuation-in-part of application No. 09/988,545, filed on Nov. 20, 2001, now abandoned, which is a continuation of application No. 09/603,693, filed on Jun. 26, 2000, now Pat. No. 6,319,885, which is a continuation of application No. 08/654,007, filed on May 28, 1996, now Pat. No. 6,110,881, which is a continuation of application No. 08/078,657, filed on Jun. 21, 1993, now abandoned, which is a continuation-in-part of application No. 07/911,102, filed on Jul. 9, 1992, now Pat. No. 5,334,332.

(51) Int. Cl.
C11D 7/50 (2006.01)
C11D 7/32 (2006.01)

(52) U.S. Cl. ............... 510/175; 510/176; 510/245; 510/255; 510/264; 510/407; 510/499
(58) Field of Classification Search ............... 510/176, 510/175, 255, 499, 245, 264; 134/2, 3, 113
See application file for complete search history.

(56) References Cited

U.S. PATENT DOCUMENTS

| | | | |
|---|---|---|---|
| 4,617,251 A | | 10/1986 | Sizensky |
| 5,417,877 A | | 5/1995 | Ward |
| 5,798,323 A | * | 8/1998 | Honda et al. ............... 510/176 |
| 5,911,835 A | * | 6/1999 | Lee et al. .................... 134/1.3 |
| 5,968,848 A | * | 10/1999 | Tanabe et al. ............. 438/745 |
| 5,997,658 A | | 12/1999 | Peters et al. |
| 6,068,000 A | * | 5/2000 | Tanabe et al. ............... 134/1.3 |
| 6,110,881 A | * | 8/2000 | Lee et al. .................... 510/175 |
| 6,218,087 B1 | * | 4/2001 | Tanabe et al. ............. 430/331 |
| 6,261,745 B1 | | 7/2001 | Tanabe et al. |

(Continued)

FOREIGN PATENT DOCUMENTS

EP 1 178 359 2/2002

(Continued)

Primary Examiner—Gregory Webb
(74) Attorney, Agent, or Firm—Morgan Lewis & Bockius LLP

(57) ABSTRACT

The present invention is directed to resist and etching residue removing compositions containing at least one nucleophilic amine compound possessing reduction and oxidation potentials, a two-carbon atom linkage alkanolamine compound, and optionally water and/or one or more corrosion inhibitors. The compositions may be substantially free of hydroxylamine, polar organic solvents, water, corrosion inhibitors, or a combination thereof. The compositions are useful in processes for removing resists and etching residue from metal or metal alloy substrates or substrate layers used in micro-circuitry fabrication.

20 Claims, 13 Drawing Sheets

U.S. PATENT DOCUMENTS

| | | |
|---|---|---|
| 6,268,323 B1 | 7/2001 | Honda et al. |
| 6,276,372 B1 | 8/2001 | Lee |
| 6,319,885 B1 * | 11/2001 | Lee et al. .................. 510/175 |
| 6,320,064 B1 | 11/2001 | Oftring et al. |
| 6,326,130 B1 | 12/2001 | Schwartzkopf et al. |
| 6,372,050 B1 | 4/2002 | Honda et al. |
| 6,372,410 B1 * | 4/2002 | Ikemoto et al. ............. 430/318 |
| 6,492,311 B1 * | 12/2002 | Lee et al. .................. 510/176 |
| 6,777,380 B1 * | 8/2004 | Small et al. ................ 510/176 |

FOREIGN PATENT DOCUMENTS

| | | |
|---|---|---|
| JP | 10321569 | 12/1998 |
| JP | 2001077063 | 3/2001 |

* cited by examiner

CLEANING COMPOSITIONS CONTAINING HYDROXYLAMINE DERIVATIVES AND PROCESSES USING SAME FOR RESIDUE REMOVAL

CROSS-REFERENCE TO RELATED APPLICATIONS

This application is a continuation-in-part of application Ser. No. 10/162,679 filed Jun. 6, 2002, now U.S. Pat. No. 6,825,156 entitled "Semiconductor process residue removal composition and process," and a continuation-in-part of application Ser. No. 09/988,545 filed Nov. 20, 2001, now abandoned entitled "Cleaning solutions including nucleophilic amine compound having reduction and oxidation potentials," which is a continuation of application Ser. No. 09/603,693 filed Jun. 26, 2000, which issued as U.S. Pat. No. 6,319,885 on Nov. 20, 2001, which is a continuation of application Ser. No. 08/654,007 filed May 28, 1996, which issued as U.S. Pat. No. 6,110,881 on Aug. 29, 2000, which is a continuation of application Ser. No. 08/078,657, filed Jun. 21, 1993, now abandoned, which is a continuation-in-part of application Ser. No. 07/911,102 filed Jul. 9, 1992, which issued as U.S. Pat. No. 5,334,332 on Aug. 2, 1994, the entire disclosures of each of which applications and/or patents is hereby incorporated by express reference hereto.

FIELD OF THE INVENTION

The present invention is directed to resist and etching residue removing compositions containing at least one nucleophilic amine compound possessing reduction and oxidation potentials, a two-carbon atom linkage alkanolamine compound, and optionally water and/or one or more corrosion inhibitors. The compositions are useful in processes for removing resists and etching residue from microcircuitry during fabrication.

BACKGROUND OF THE INVENTION

During the fabrication of microcircuits, the precise positioning of a number of appropriately doped regions on a slice of semiconductor is required followed by the positioning of one or more interconnection patterns on the semiconductor. Positive-type resists have been extensively used as masking materials to delineate patterns onto a substrate so that the patterns can be subsequently etched or otherwise defined into the substrate. The final steps in preparing the substrate then involve removing the unexposed resist material and any etching residue from the substrate. Increasingly, however, plasma etching, reactive ion etching or ion milling is used to define the pattern in a substrate which renders the resist mask substantially impossible to remove by stripping agents heretofore commonly used for such or similar purposes containing one or more of the following solvents: halogenated hydrocarbons such as, for example, methylene chloride or tetrachloroethylene; amines and their derivatives such as, for example, dimethylformamide, dimethylacetamide, pyrrolidone, diethanolamine, and triethanolamine; glycol ethers, such as, for example, ethylene glycol monoethyl ether, 2-butoxyethanol, and 2-(butoxy-ethoxy)ethanol; and an alkylsulfone, such as, for example, dimethylsulfone.

Additionally, during such etching processing, an organometallic by-product compound can be formed on the sidewall of the substrate material. The above-mentioned solvents are also ineffective in removing such organometallic polymers. A recently developed technique effective for photoresist removal is plasma oxidation, also known as plasma ashing. However, while this process is effective for removing a photoresist, it is not effective for removing the organometallic polymer formed on the sidewall of the substrate during the etching process.

Further, polyimides are increasingly used in microelectronics as fabrication aids, passivants, and inter-level insulators. The use of a polyimide as a fabrication aid includes application of the polyimide as a photoresist, planarization layer in a multi-level photoresist scheme and as an ion implant mask. In these applications, the polymer is applied to a wafer or substrate, subsequently cured or patterned by a suitable method and removed after use. Many conventional strippers are not sufficiently effective in removing the polyimide layer once the polyimide has been subjected to a severe curing operation. The removal of such polyimides is normally accomplished by boiling the substrate in hydrazine or in oxygen plasma.

Accordingly, a composition suitable for stripping a resist so as to remove the resist rapidly and completely would provide substantial advantages over conventional strippers. Further, a composition capable of removing both the resist and organometallic by-products would provide even a greater advantage. As apparent, if an etching residue is not completely removed from the substrate, the residue can interfere with subsequent processes involving the substrate.

In addition to removing completely the resist material, particularly with the introduction of submicron process techniques to form wafers, there is a demand for cleaning technology for removing etching residue remaining following resist removal. The requirement for a cleaning solution to remove all types of residue generated as a result of plasma etching of various types of metals, such as aluminum, aluminum/silicon/copper, titanium, titanium nitride, titanium/tungsten, tungsten, copper, silicon oxide, polysilicon crystal, etc., presents a need for more effective cleaning chemistry in the processing area.

More specifically, during the fabrication of microcircuits, the substrate surface can be aluminum, titanium, silicon oxide or polysilicon and patterns are delineated thereon by chemical etching. Increasingly, plasma etching, reactive ion etching or ion milling are used, and such etching processes produce undesirable by-products from the interaction of the plasma gases, reacted species and the photoresist. The composition of such by-products is generally made up of the etched substrates, underlying substrate, photoresist and etching gases. The formation of such by-products is influenced by the type of etching equipment, process conditions and substrates utilized. These by-products are generally referred to as "sidewall polymer," "veil", "fences", "rabbit ears" or "goat horns", and cannot be removed completely by either oxygen plasma or conventional solvents, such as N-methyl-2-pyrrolidone, diethyleneglycol monobutyl ether, dimethylacetamide, or the like, which are conventionally used to remove resists. It is critical that all of the etching residue and the like be removed to provide a wafer having sufficient integrity for subsequent use of the wafer in microcircuitry.

Examples of alkaline/solvent mixtures useful as photoresist strippers, but not necessarily cleaners, known for use in stripping applications include dimethylacetamide or dimethylformamide and alkanolamines as described in U.S. Pat. Nos. 4,770,713 and 4,403,029; 2-pyrrolidone, dialkylsulfone and alkanolamines as described in U.S. Pat. Nos. 4,428,871, 4,401,747, and 4,395,479; and 2-pyrrolidone and tetramethylammonium hydroxide as described in U.S. Pat. No. 4,744,834. Such stripping compositions, however, have only proven successful in cleaning "sidewall polymer" from the contact openings and metal line etching in simple microcircuit manufacturing involving a single layer of metal when the metal structure involves mainly Al—Si or Al—Si—Cu and the "sidewall polymer" residue contains only an organometallic compound with aluminum. The cleaning mechanism involving such materials has been studied by EKC Technology, Inc. and Intel Corp., as presented at the K.T.I. Conference in 1989 in the presentation entitled "*Metal Corrosion in Wet Resist Stripping Process,*" by P. L. Pai, C. H. Ting, W. N. Lee and R. Kuroda. Due to the corrosive nature of such strippers as above described, the "sidewall polymer" is removed either by attacking the organoaluminum compound or the metal surface itself and causing the "sidewall polymer" residue to be lifted off. Further, in addition to the use of the stripping composition, mechanical scrubbing, such as ultrasonic vibration, is required to achieve complete removal of the "sidewall polymer."

The most current submicron processing techniques utilized in the industry involving multi-levels of metal and multi-level of interconnecting processes usually incorporate metal materials including TiN, TiW, Ti, TiSi, W, WSi, and the like. The use of such materials results in the generation of new organometallic material by-products during plasma etching, whether formed intentionally or unintentionally, which renders the cleaning incomplete when utilizing existing commercially available stripping and cleaning products. Such findings were described at the SPIE Symposium on Microlithography in 1991 in a presentation entitled "*Plasma Etching and Reactive Ion Etching*" by John W. Coburn. In particular, it has been found that the residue remaining on the substrate surface after removal of a resist by plasma ashing has changed from the organometallic to the corresponding oxide, such as $TiO_2$, which is chemically inert to mild alkaline strippers. The effect of such poor cleaning results in low device yield, low device reliability, and low device performance.

Therefore, conventional stripping compositions—are ineffective in removing sidewall organometallic and other metal oxide residue which is present following use of the current technology to remove resists. Even plasma ashing, which has been found effective for removing photoresists, is not effective for removing the sidewall organometallic polymer and some other of the metal oxide residues formed during etching processes.

Additionally, because many of the toxic components of such compositions are highly volatile and subject to unduly high evaporation rates, the compositions require special human and environmental safety precautions to be taken during storage and use of said compositions.

The resists may in some locations be altered, for example by etching, into various compounds, which incorporate the altered resist, as well as some usually altered substrate. For example, oxygen plasma oxidation is often used for removal of resists or other polymeric materials after their use, during the fabrication process has been completed. Such high energy processes typically result in the formation of organometallic and other residues, for example metal oxides, on sidewalls of the structures being formed in the fabrication process. Other etching, including the use of directed energy and/or chemical etching, leave different types of residue, for example organometallic compounds and/or metal fluorides. Finally, direct layer deposition using convertible organometallic compounds, which may or may not require etching to form a pattern, may leave yet other types of residues. These residues must be removed without substantially altering the underlying substrate.

U.S. Pat. No. 6,372,050 teaches a composition for cleaning residue from a substrate that contains 5 to 50% of a solvent selected from a particular group that includes M-methyl-2-pyrrolidone (NMP), dimethyl sulfoxide (DMSO), N,N-dimethylacetamide, and many others; 10 to 90% of an alkanolamine selected from diethyleneglycolamine (DGA), monoethanolamine (MEA), diethanolamine (DEA), triethanolamine (TEA), AEEA, and mixtures thereof; from 0.1 to 10% of a carboxylic acid selected from formic acid, acetic acid, phthalic acid, salicylic acid, oxalic acid, and many others; and 1 to 40% water.

A variety of metal and other layers are commonly employed in integrated circuit fabrication, including aluminum, aluminum/silicon/copper, copper, titanium, titanium nitride, titanium/tungsten, tungsten, silicon oxide, polysilicon crystal, and the like. The use of such different layers results in the formation of different organometallic residues in the high energy processes. Further, there is almost always at least two, but in some cases there may be more than two substrate types on an outer layer to be cleaned. A cleaning composition is often designed to be compatible with a single substrate exposed to the cleaning composition.

A variety of residue removal compositions and processes suitable for integrated circuit fabrication have been developed and marketed by EKC Technology, Inc. (hereinafter "EKC"), the assignee of the present application. Some of these compositions and processes are also useful for removing photoresist, polyimide, or other polymeric layers from substrates in integrated circuit fabrication, and EKC has also developed a variety of compositions and processes specifically for removing such polymeric layers from substrates in integrated circuit fabrication. Additionally, EKC has developed a variety of compositions and processes to selectively remove specific substrate compositions from a substrate surface at a controlled rate. Such compositions and processes are disclosed in the following commonly assigned issued patents:

U.S. Pat. No. 6,367,486 to Lee et al., which issued on Apr. 9, 2002, entitled Ethylenediaminetetraacetic acid or its ammonium salt semiconductor process residue removal process;

U.S. Pat. No. 6,313,039 to Small et al., which issued on Nov. 6, 2001, entitled Chemical mechanical polishing composition and process;

U.S. Pat. No. 6,276,372 to Lee, which issued on Aug. 21, 2001, entitled Process using hydroxylamine-gallic acid composition;

U.S. Pat. No. 6,251,150 to Small et al., which issued on Jun. 26, 2001, entitled Slurry composition and method of chemical mechanical polishing using same;

U.S. Pat. No. 6,248,704 to Small et al., which issued on Jun. 19, 2001, entitled Compositions for cleaning organic and plasma etched residues for semiconductors devices;

U.S. Pat. No. 6,242,400 to Lee, which issued on Jun. 5, 2001, entitled Method of stripping resists from substrates using hydroxylamine and alkanolamine;

U.S. Pat. No. 6,235,693 to Cheng et al., which issued on May 22, 2001, entitled Lactam compositions for cleaning organic and plasma etched residues for semiconductor devices;

U.S. Pat. Nos. 6,187,730 and 6,221,818, both to Lee, which issued on Feb. 13, 2001 and on Apr. 24, 2001, respectively, entitled Hydroxylamine-gallic compound composition and process;

U.S. Pat. No. 6,156,661 to Small, which issued on Dec. 5, 2000, entitled Post clean treatment;

U.S. Pat. No. 6,140,287 to Lee, which issued on Oct. 31, 2000, entitled Cleaning compositions for removing etching residue and method of using;

U.S. Pat. No. 6,121,217 to Lee, which issued on Sep. 19, 2000, entitled Alkanolamine semiconductor process residue removal composition and process;

U.S. Pat. No. 6,117,783 to Small et al., which issued on Sep. 12, 2000, entitled Chemical mechanical polishing composition and process;

U.S. Pat. No. 6,110,881 to Lee et al., which issued on Aug. 29, 2000, entitled Cleaning solutions including nucleophilic amine compound having reduction and oxidation potentials;

U.S. Pat. No. 6,000,411 to Lee, which issued on Dec. 14, 1999, entitled Cleaning compositions for removing etching residue and method of using;

U.S. Pat. No. 5,981,454 to Small, which issued on Nov. 9, 1999, entitled Post clean treatment composition comprising an organic acid and hydroxylamine;

U.S. Pat. No. 5,911,835 to Lee et al., which issued on Jun. 15, 1999, entitled Method of removing etching residue;

U.S. Pat. No. 5,902,780 to Lee, which issued on May 11, 1999, entitled Cleaning compositions for removing etching residue and method of using;

U.S. Pat. No. 5,891,205 to Picardi et al., which issued on Apr. 6, 1999, entitled Chemical mechanical polishing composition;

U.S. Pat. No. 5,672,577 to Lee, which issued on Sep. 30, 1997, entitled Cleaning compositions for removing etching residue with hydroxylamine, alkanolamine, and chelating agent;

U.S. Pat. No. 5,482,566 to Lee, which issued on Jan. 9, 1996, entitled Method for removing etching residue using a hydroxylamine-containing composition;

U.S. Pat. No. 5,399,464 to Lee, which issued on Mar. 21, 1995, entitled Triamine positive photoresist stripping composition and post-ion implantation baking;

U.S. Pat. No. 5,381,807 to Lee, which issued on Jan. 17, 1995, entitled Method of stripping resists from substrates using hydroxylamine and alkanolamine;

U.S. Pat. No. 5,334,332 to Lee, which issued on Aug. 2, 1994, entitled Cleaning compositions for removing etching residue and method of using;

U.S. Pat. No. 5,279,771 to Lee, which issued on Jan. 18, 1994, entitled Stripping compositions comprising hydroxylamine and alkanolamine;

U.S. Pat. No. 4,824,763 to Lee, which issued on Apr. 25, 1989, entitled Triamine positive photoresist stripping composition and prebaking process; and U.S. Pat. No. 4,395,348 to Lee, which issued on Jul. 26, 1983, entitled Photoresist stripping composition and method;

the entire disclosures of all of which are incorporated herein for all purposes by express reference thereto. These compositions have achieved substantial success in integrated circuit fabrication applications.

U.S. Pat. No. 5,997,658 describes a remover for photoresist and etching residue that contains water, an amine, and a corrosion inhibitor including benzotriazole, gallic acid, or both.

As a result of a continuous effort to decrease critical dimension size in the integrated circuit industry, such as in the fabrication of sub-micron size devices, etching residue removal and substrate compatibility with chemicals employed in wet processing is becoming more and more critical for obtaining acceptable yield in very large scale integration (VLSI) and ultra large scale integration (ULSI) processes. The effectiveness of residue removal by etching, to a large extent, depends on the composition of the surfaces or materials to be etched and the composition of the etchant, as well as many other variables too numerous to mention. The composition of such etching residue is generally made up primarily of the etched substrates, underlying substrate, etched and/or ashed photoresist, and etching gases. The substrate compatibility of the wafers with wet chemicals is highly dependent on the processing of the polysilicon, multilevel interconnection dielectric layers, and metallization in thin film deposition, etching and post-etch treatment of the wafers. Processing conditions are often quite different from one fabrication process to another, making it difficult to apply a particular composition to obtain both effective residue removal and substrate compatibility. For example, some compositions have produced corrosion on certain metal substrates, such as those including a titanium metal layer. Titanium has become more widely used in semiconductor manufacturing processes. It is employed both as a barrier layer to prevent electromigration of certain atoms and as an antireflector or refractory metal layer on top of other metals. Used in such a capacity, the layer is often very thin, and corrosion or etching during cleaning operations may compromise the purpose of the layer.

Hydroxylamine (HA) formulations have been found to be useful in the removal of substrate, for example as an etchant used in chemical-mechanical etching processes, as described in U.S. Pat. Nos. 6,313,039; 6,251,150; and 6,117,783.

Hydroxylamine formulations have also been useful in removing photoresists, such as is found in U.S. Pat. Nos. 5,279,771 and 5,381,807, which describe formulations containing hydroxylamine, an alkanolamine, and optionally a polar organic solvent. Hydroxylamine formulations have also been useful in removing etching residue, such as is found in U.S. Pat. No. 5,334,332, which describes a formulation containing hydroxylamine, an alkanolamine, water, and a chelating agent. Hydroxylamine-containing formulations designed to remove residues are known to be aggressive to metals, particularly to titanium film and under more aggressive process conditions to aluminum film.

As a result, various formulations have been developed to control the corrosion. The attack of titanium can be moderated by using different chelator, e.g., such as disclosed in U.S. Pat. No. 6,276,372, and /or by selecting a class of alkanolamine with 2-carbon linkage(s), which is disclosed, e.g., in U.S. Pat. No. 6,121,217. For example, other formulations include those disclosed in: U.S. Pat. Nos. 6,276,372, 6,221,818, and 6,187,730, which each describe a hydroxylamine formulation with a gallic compound (as opposed to catechol) and an alcohol amine; U.S. Pat. No. 6,242,400, which describes a hydroxylamine formulation with an alcohol amine and a polar organic solvent; U.S. Pat. Nos. 6,156,661 and 5,981,454, which each describe a buffered hydroxylamine formulation with an organic acid; U.S. Pat. Nos. 6,140,287 and 6,000,411, which each describe a hydroxylamine formulation with an alkanolamine and a chelating agent; U.S. Pat. No. 6,121,217, which describes a hydroxylamine formulation with an alkanolamine and gallic acid or catechol; U.S. Pat. No. 6,110,881, which describes a hydroxylamine formulation with an organic solvent, water, and a chelating agent; U.S. Pat. No. 5,911,835, which describes a nucleophilic amine compound formulation with an organic solvent, water, and a chelating agent; and U.S. Pat. Nos. 5,902,780, 5,672,577, and 5,482,566, which each describe a hydroxylamine formulation with an alkanolamine, water, and a dihydroxybenzene chelating agent.

U.S. Pat. No. 5,997,658 to Peters et al. describes a hydroxlamine-free photoresist stripping and cleaning composition, for use particularly of copper or titanium substrates, having about 70 to 85% by weight of an alkanolamine, about 0.5 to 2.5% by weight of benzotriazole, about 0.5 to 2.5% by weight of gallic acid and the remainder being water. Alkanolamines include N-methylethanolamine (NMEA), monoethanolamine (MEA), diethanolamine, mono-, di-, and tri-isopropanolamine, 2-(2-aminoethylamino)-ethanol, 2-(2-aminoethoxy)-ethanol, triethanolamine, and the like. The preferred alkanolamine is N-methylethanolamine (MEA).

Additionally, U.S. Pat. No. 5,928,430 to Ward et al., entitled Aqueous stripping and cleaning compositions containing hydroxylamine and use thereof, describes an aqueous stripping composition comprising a mixture of about 55% to 70% by weight of a polar amine solvent, about 22.5 to 15% by weight of a basic amine, especially hydroxylamine, gallic acid as a corrosion inhibitor, and water. U.S. Pat. No. 5,419,779 to Ward describes a stripping composition containing water, 22.5 to 15% by weight of hydroxylamine, 55% to 70% monoethanolamine, and preferably up to about 10% by weight of a corrosion inhibitor, particularly one selected from the group consisting of catechol, pyrogallol, anthranilic, acid, gallic acid, and gallic ester.

Other cleaning-type compositions exist, for example as found in U.S. Pat. No. 6,261,745 to Tanabe et al., entitled Post-ashing treating liquid compositions and a process for treatment therewith, which describes a post-ashing treating liquid composition comprising a salt of hydrofluoric acid with a base free from metal ions, a water-soluble organic solvent, water, and an acetylene alcohol/alkylene oxide adduct.

Other prior art, e.g., U.S. Pat. Nos. 6,372,050, 6,326,130, 6,268,323, 6,261,745, 5,997,658, 5,417,877, and 4,617,251, inter alia, have demonstrated the corrosion of the aluminum metal film caused by various amines and other compounds in photoresist stripper formulations.

However, further development of integrated circuits and their fabrication processes have created a need for improvement in residue removal compositions and processes.

OBJECTS OF THE INVENTION

The cleaning and substrate etching characteristics of a formulation will change as the amounts of the components change. Some manufacturers provide replenishing solutions that contain one or more components that are lost over time while storing the residue remover at operating temperature. Since low-boiling-temperature organics are preferentially lost and these low-boiling-temperature organics have lower flash points than high-boiling-temperature organics, this replenishing formulation typically has a very low flash point. During the process of adding the replenishing solutions, the system may have localized areas where the temperature exceeds the flash point of the liquid, which can result in dangerous conditions. Advantageously, for certain embodiments of this invention, replenishing solutions consist essentially of water and, optionally, a hydroxylamine derivative. The replenishing solutions are preferably substantially free of alkanolamines and polar organic solvents, and optionally chelating agents and/or corrosion inhibitors.

The etch rates of most residue remover formulations increases with increasing process temperature. Some manufacturers suggest using formulations at low temperatures, such as at 30° C., to provide low etch rates at "normal" operating temperatures. Lower temperatures do not provide adequate removal of tougher residues, which may include polymeric material, within an feasible processing time.

It is possible to use highly reactive components in residue removers, which allows elimination of many solvents and other organics. Fluoride-containing compositions can be used for oxide etch residue. This allows higher flashpoints for mixtures, in some cases exceeding 105° C. However, aluminum and titanium etch rates, at ambient temperatures, of 3 to 6 Å/minute are found in commercial inhibited formulations. Therefore, higher temperatures are not practicable for such formulations.

Finally, there may be more than one substrate exposed to a cleaner. Many cleaner formulations exhibit reduced etching activity for one substrate but poor etching activity with other substrate(s). Different etch rates will often produce undesired results.

Accordingly, one object of the invention is to provide a family of photoresist and residue removing compositions which overcomes the above and other stated problems with the prior art.

Another object of the present invention is to provide a resist and etching residue removing composition containing at least one nucleophilic amine compound which possesses oxidation and reduction potentials and one or more corrosion inhibitors; and a method of using the composition to completely remove a resist and clean a microcircuitry substrate.

A further object of the present invention is to provide a resist and etching residue removing composition having long term stability by providing a composition comprising at least one nucleophilic amine compound possessing reduction and oxidation potentials and at least one corrosion inhibitor.

A further object of the present invention is to provide a resist and etching residue removing composition including at least one nucleophilic amine compound possessing reduction and oxidation potentials, at least one solvent which is miscible with the nucleophilic amine compound, and optionally water, wherein the nucleophilic amine and the organic solvent are maintained separately and combined just prior to use and which is disposable after use due to having a short active life cycle. This composition, once formed by combining the components as identified above, can advantageously be reactivated by combining a corrosion inhibitor therewith.

A further object of the present invention is to provide a composition for removing residue formed during etching and resist removal processes from a substrate without adversely damaging the substrate surface or hindering subsequent operation or process steps involving the substrate.

Another object of this invention is to provide an improved composition for residue removal and process using such a composition suitable for meeting current semiconductor fabrication requirements.

It is another object of the invention to provide a process which is suitable for meeting the above objects.

The attainment of the foregoing and related objects, advantages, and features of the invention should be more readily apparent to those skilled in the art, after review of the following more detailed description of the invention, taken together with the examples and claims, as described herein.

SUMMARY OF THE INVENTION

The present invention is directed to a resist and etching residue removing composition comprising at least one nucleophilic amine compound having oxidation and reduction potentials, at least one organic solvent which is miscible with the nucleophilic amine compound, water and, optionally, one or more corrosion inhibitors. The water can be added to the composition by itself or as a carrier for the nucleophilic amine compound, i.e., the nucleophilic amine being present in aqueous solution.

Related application, U.S. Ser. No. 610,044 filed Nov. 5, 1990, which is incorporated herein by reference and which corresponds to published European Patent Application No. 485,161 A1, discloses hydroxylamine in combination with an alkanolamine which is miscible with the hydroxylamine as being useful to remove a resist from a substrate. It has now been found that compounds other than hydroxylamine and an alkanolamine are useful for removing resists, but in particular are also useful in removing etching residues from substrates. It has been found that nucleophilic amine compounds having oxidation and reduction potentials satisfactorily remove resists and etching residue from a substrate when combined with an organic solvent which is miscible with the nucleophilic amine compound and water. While the nucleophilic amine compound must have the potential for reduction and oxidation, it is not required that reduction and oxidation actually occur in the use of the composition. Examples of nucleophilic amine compounds useful in the present invention include hydroxylamines, hydrazines, certain specified amines, and their derivatives as further described below. The organic solvent is not required to be an amine, but the presence of an amine solvent is preferred.

Further, it has been found that when a corrosion inhibitor is present in a composition containing at least one nucleophilic amine compound having reduction and oxidation potentials that at least two additional surprising benefits are achieved, namely, (1) the corrosion inhibitor assists in cleaning by retaining etching residue in the cleaning solution and thereby avoiding resettling of the residue onto the substrate and (2) the corrosion inhibitor serves as a stabilizing agent to provide long term effectiveness to the composition. The presence of the corrosion inhibitor further provides the composition with long term activity and, therefore, a long shelf life. When a corrosion inhibitor is not present in the composition containing a nucleophilic amine compound, depending on the nature or presence of a two-carbon atom linkage alkanolamine compound, the solution may have only short term stability, e.g., generally an active life of about one week. Accordingly, when a corrosion inhibitor is not present, it is preferable to maintain the nucleophilic amine compound separately from any other compounds in the composition until just prior to use. After the components are combined and the solution used, the remaining solution can be disposed of, or, once the activity has decreased, the solution can be reactivated by the addition of a corrosion inhibitor. In one embodiment, the corrosion inhibitors include dihydroxybenzenes and their derivatives, as further described below.

The cleaning composition is especially useful in removing etching residue from substrates which contain metal elements other than aluminum such as titanium (Ti), tungsten (W), silicon (Si) and silicon oxide ($SiO_2$). While the compositions of the invention are capable of removing resists from substrates, the compositions of the invention have been shown to have a surprising capacity for cleanly removing etching residue, in particular organometallic and metal oxide etching residue, from a substrate surface following removal of a resist therefrom. Currently in the industry, etching residue is extremely difficult to completely remove without damaging the substrate.

The cleaning compositions of the present invention are particularly suitable for removing organometallic and metal oxide residues from a substrate, in particular, during the fabrication of a submicron (i.e., less than 0.8 microns) integrated circuit without adversely affecting or hindering subsequent manufacturing operation or process steps involving the substrate. Further, the cleaning compositions of the invention are effective in removing organometallic residue outgasing which has been deposited on parts of the etching equipment utilized in the processing. This equipment can be made of polycarbonate, ceramic, aluminum, or a like material.

The method of removing a resist or etching residue from a substrate using the compositions of the present invention also is advantageous in that complex process steps and equipment are not required. The method of the invention involves contacting a substrate containing a resist or etching residue with the composition of the invention as described herein at a temperature and for a time sufficient to remove the particular resist or etching residue present.

BRIEF DESCRIPTION OF THE DRAWINGS

As shown in FIGS. 7A and

Figure 7A:
FIGS. 7A–7D show the results of comparison tests using a cleaning composition of the present invention (FIGS. 7A and 7B) and a N-methyl-2-pyrrolidone solvent alkanolamine base stripper (FIGS. 7C and 7D) in relation to openings on a silicon oxide dielectric layer.
Figure 7B:
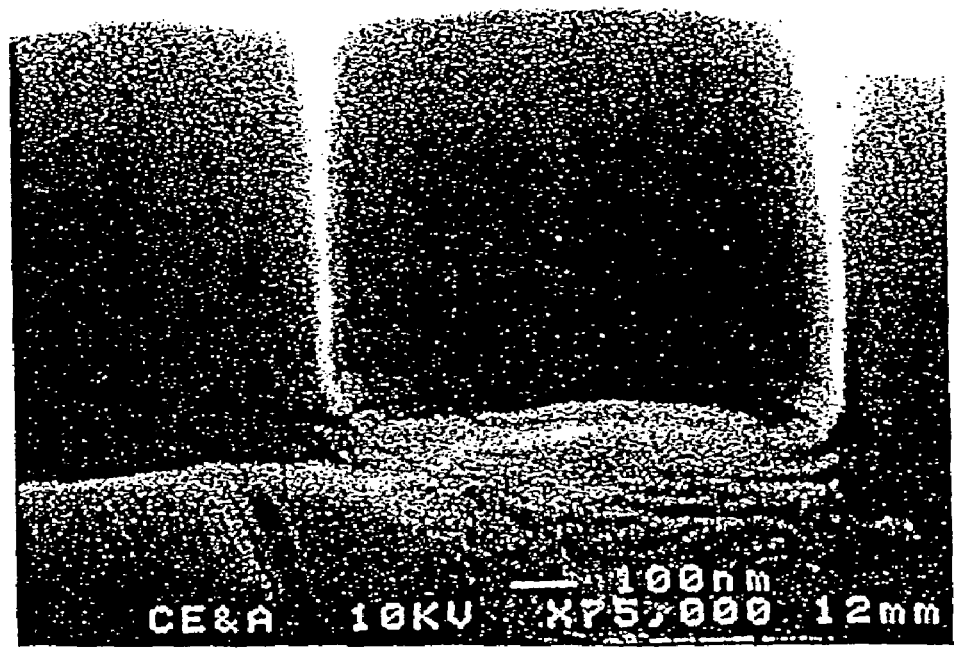
Figure 7C:
Figure 7D:
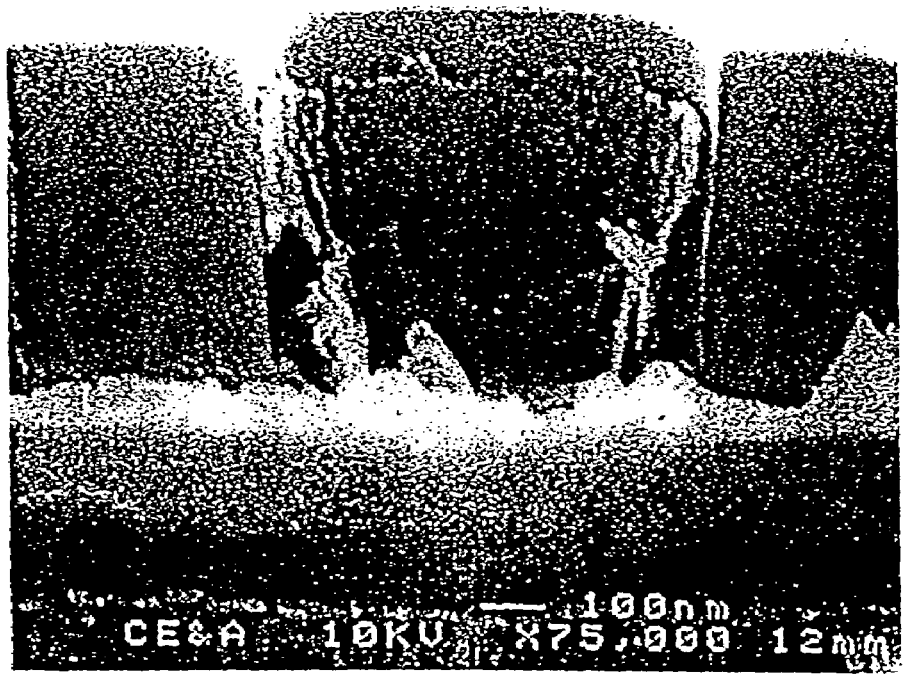

78, all the organometallic residue was removed using the composition of the present invention while, as evident from FIGS. 7C and 7D, residue remained on the substrate treated with the stripper.

Figure 8A:
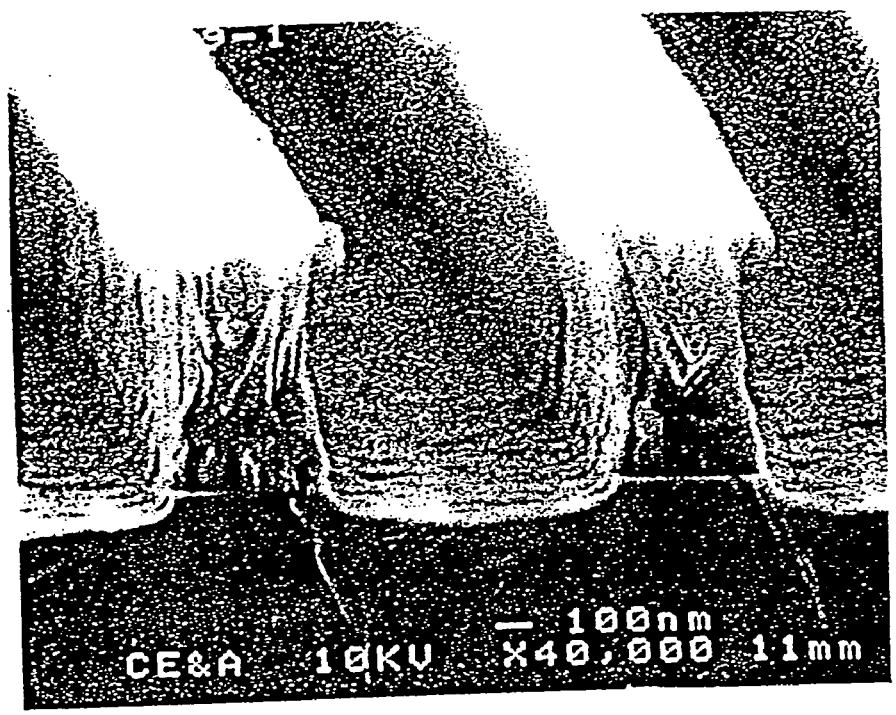
Figure 8B:
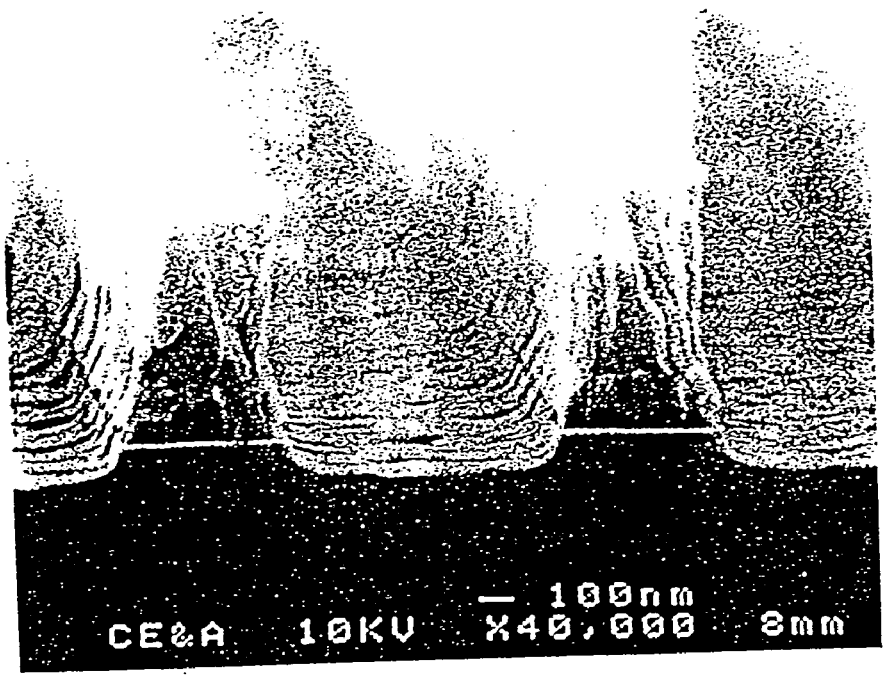

FIG. 8A shows residue remaining on a wafer following etching and the removal of a photoresist therefrom. FIG. 8B shows the same wafer following cleaning with a composition of the present invention. All the residue on the wafer was removed.

Figure 9:
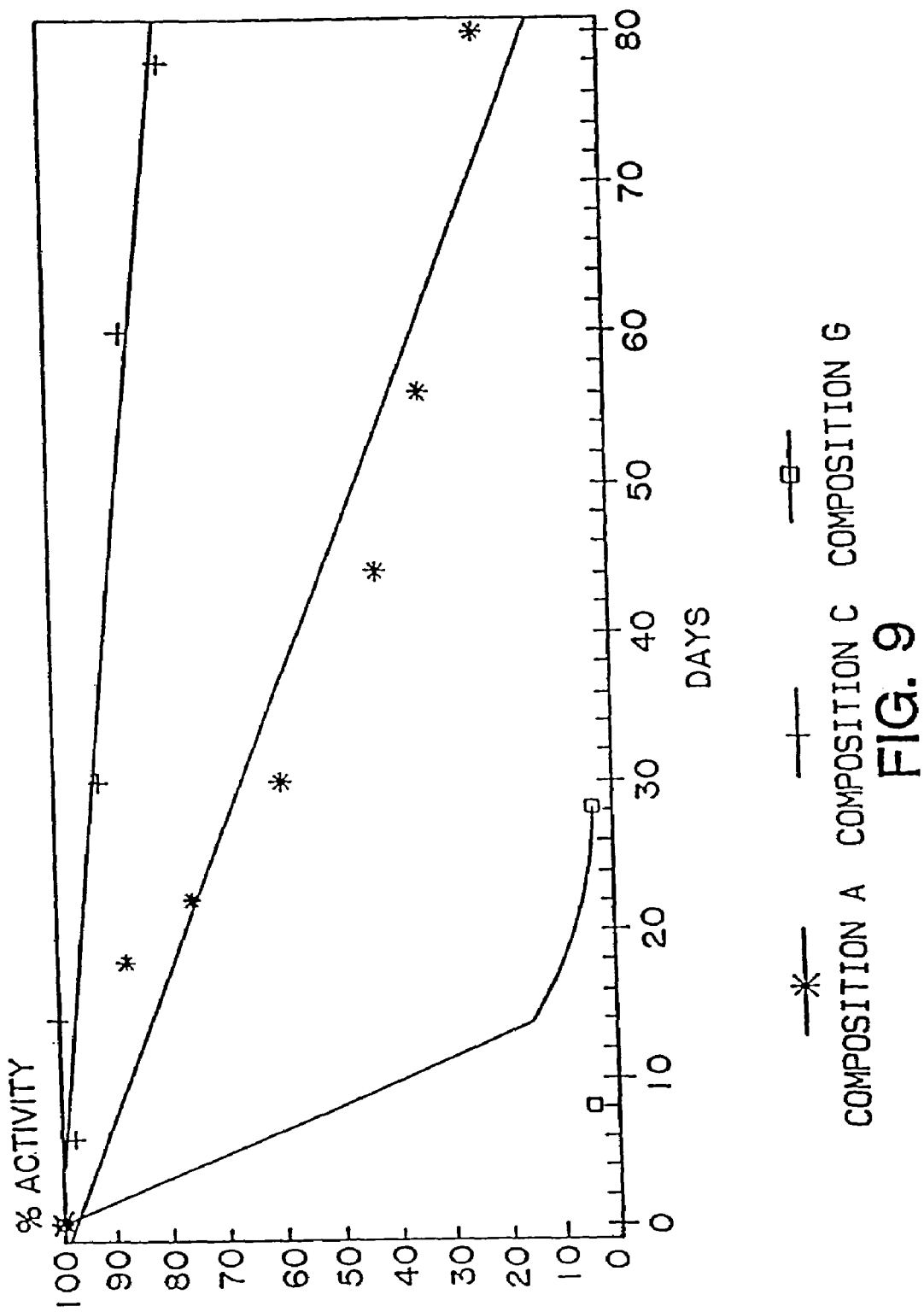

FIG. 9 illustrates the results of Example 11 below wherein the stability of cleaning Compositions A, C and G were compared.

Figure 10:
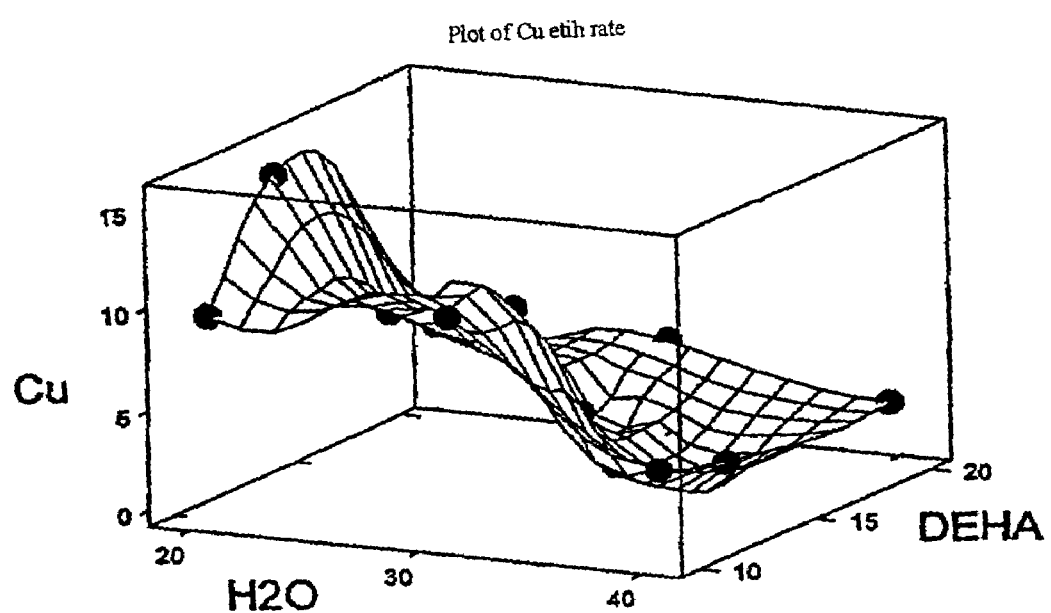
Figure 11:
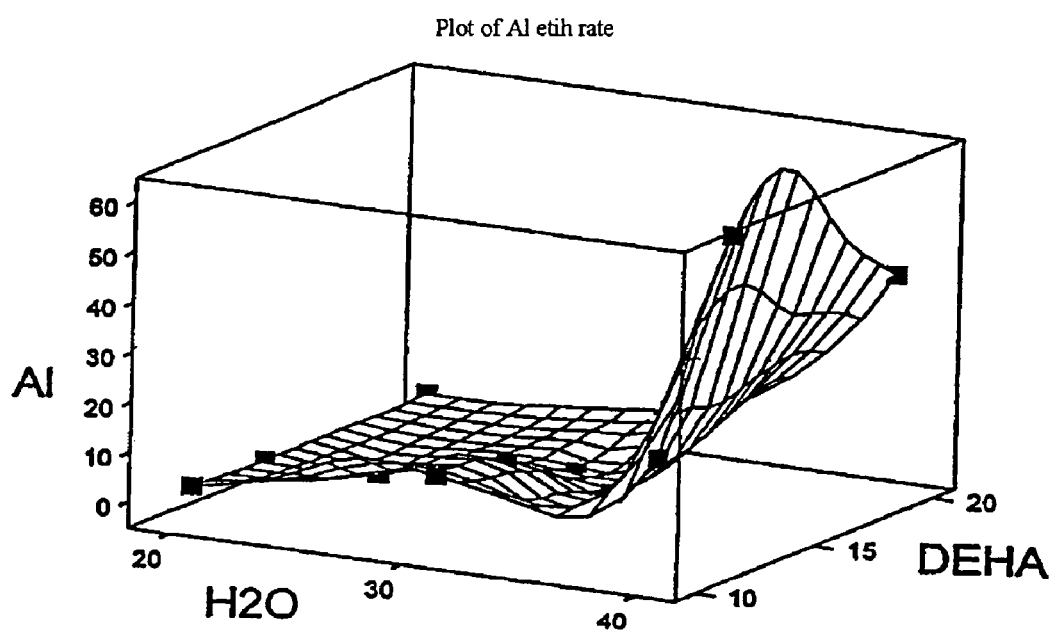
Figure 12:
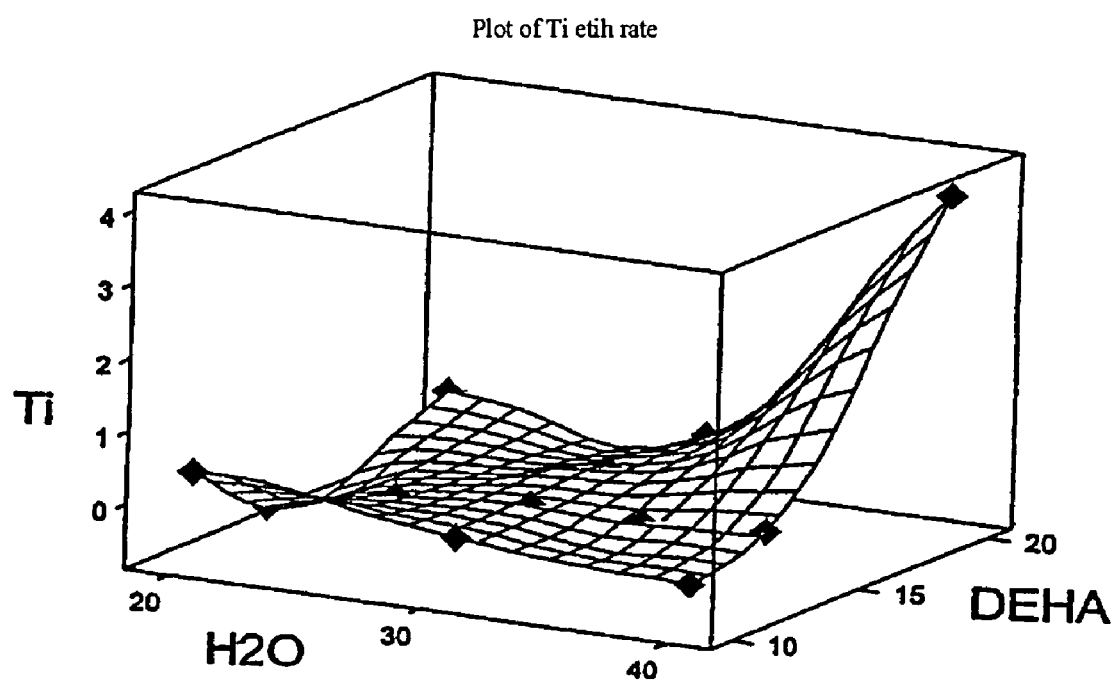

FIGS. 10, 11, and 12 each show a graphical chart representing the etch rate of a substrate (copper, aluminum, and titanium, respectively) based on the relative amounts of water and N,N-diethylhydroxylamine present.

DEFINITIONS

Unless otherwise specified, all percentages expressed herein should be understood to refer to percentages by weight. Also, the term "about," when used in reference to a range of values, should be understood to refer to either value in the range, or to both values in the range.

As used herein, the phrases "contains substantially no," "is substantially free from," or "substantially [something]-free," in reference to a composition means:

for major components including alkanolamines or nucleophilic amines, polar organic solvents, non-hydroxyl-containing amines, water, organic solvents, hydroxylamine and hydroxylamine derivatives, the aforementioned phrases should be understood to mean that the composition contains less than 1.5%, preferably less than about 1%, more preferably less than about 0.1%, of the specific element mentioned thereafter;

for minor components including chelating agents, corrosion inhibitors, HF and HF salts, surfactants, and the like, the aforementioned phrases should be understood to mean that the composition contains less than 0.2%, preferably less than about 0.1%, most preferably less than about 0.01%, of the specific element mention thereafter; and for trace contaminants such as metal ions, substantially free is defined in the specification, e.g., less than 10 ppm metals and metal ions.

Preferably, when one of the aforementioned phrases is used, the composition is completely free of any added element specifically mentioned thereafter, or at least does not contain the added element in an amount such that the element affects the efficacy, storability, usability regarding necessary safety concerns, or stability of the composition.

Unless otherwise specified, and wherever possible, a compound should generally not be characterized under more than one enumerated element of the composition according to the invention. If a compound is capable of being characterized under, for example, two enumerated embodiments of the composition, such a compound may be characterized herein only under either one of the two enumerated elements, but not under both. At times, the distinction may be made based on the content of the compound in the composition. For instance, catechol or gallic acid can act primarily as a corrosion inhibitor at "high" concentrations, e.g. about 0.5% to 20%, or primarily as a metal chelator at "low" concentrations, e.g., in the ppm to 0.5 wt % range.

As used herein, hydroxylamine and hydroxyamine derivatives are not considered organic, despite the organic substituents that may be present on substituted hydroxylamine.

As used herein, an "acceptably low etch rate," when referring to etching of a substrate layer by a composition, should be understood to mean that the composition causes not more than about 5 Å/min etching of the substrate layer, alternately not more than about 3 Å/min etching of the substrate layer, for example not more than about 1 Å/min etching of the substrate layer, upon contact under given conditions for an enumerated period of time.

DETAILED DESCRIPTION OF THE PREFERRED EMBODIMENTS

The cleaning and stripping composition of the present invention for removing etching residue and resists from a substrate contains at least one nucleophilic amine compound having oxidation and reduction potentials in a cleaning environment, at least one organic solvent which is miscible with the nucleophilic amine compound, water, and, optionally, one or more corrosion inhibitors. The water can be provided in the composition independently or in combination with the nucleophilic amine compound, for example the nucleophilic amine compound can be added as 50% aqueous solution.

In a composition according to the invention, the composition preferably contains a corrosion inhibitor. The corrosion inhibitor serves to provide long term stability and activity to the composition. The composition, therefore, has the desirable commercial attribute of having a long shelf life.

Alternatively, the composition can be provided including at least one nucleophilic amine compound having reduction and oxidation potentials, an organic solvent and water. This composition, however, only has short term effectiveness and so it is preferable that the nucleophilic amine compound and organic solvent are maintained separate until just prior to use. As stated above, the water can be present in combination with the nucleophilic amine compound. In this case the nucleophilic amine compound in aqueous solution will be maintained separate from the organic solvent until just prior to use. The components are then combined and the composition used as needed. Generally, the composition without a corrosion inhibitor will have an effective active life for approximately one week. Any unused portion of the composition can then be simply disposed of or, alternatively, the unused portion can be reactivated by the addition of a corrosion inhibitor to the solution.

The composition of the invention can be used as a stripping composition to remove a resist or a cleaning composition to remove etching residue from a substrate. The ability to remove etching residue effectively is in particular surprising in view of the difficulty experienced in the art to produce an effective etching residue removing solution.

The cleaning compositions of the present invention are suitable for removing etching residue, such as organometallic and metal oxide residue, formed on a substrate, in particular residue formed during plasma etching processes. The substrate can include copper and non-copper metal elements such as titanium, tungsten, aluminum, silicon, and silicon oxide. The extent and type of residue remaining following etching is determined by the etching equipment utilized, process conditions and substrates utilized.

Compounds suitable for use as the nucleophilic amine compound having oxidation and reduction potentials include certain amines, hydroxylamines, hydrazines and their derivatives as set forth below. The nucleophilic amine compound used in the present invention does not have to actually take part in oxidation or reduction during a cleaning or stripping process. The nucleophilic amine compound must only possess oxidation and reduction qualities in a cleaning or stripping environment. Suitable nucleophilic amine compounds useful in the present invention include, but are not limited to, compounds having the following formulae, and quaternary ammonium salts thereof:

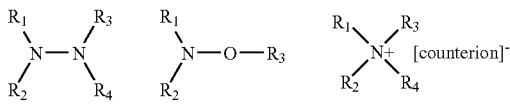

wherein $R_1$, $R_2$, $R_3$ and $R_4$ are either the same or different and include hydrogen, a hydroxyl group, a substituted $C_1$–$C_6$ straight, branched or cyclic alkyl, alkenyl or alkynyl group, a substituted acyl group, a straight or branched alkoxy group, an amidyl group, a carboxyl group, an alkoxyalkyl group, an alkylamino group, an alkyl sulfonyl group, a sulfonic acid group, or a combination thereof. Specific examples of nucleophilic amine compounds are further described below.

Hydroxylamine derivatives suitable for use as the nucleophilic amine compound having reduction and oxidation potentials are represented by the following formula:

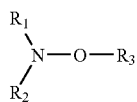

wherein $R_1$, $R_2$, and $R_3$ are independently hydrogen; a hydroxyl group; optionally a substituted $C_1$–$C_6$ straight, branched, or cyclic hydrocarbon group; optionally a substituted acyl group, straight or branched alkoxy group, amidyl group, carboxyl group, alkoxyalkyl group, alkylamino group, alkylsulfonyl group, or sulfonic acid group, or the salt of such compounds; and wherein preferably at least one of $R_1$, $R_2$, and $R_3$ is not hydrogen.

Examples of derivatives of hydroxylamine according to the invention include, but are in no way limited to, N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, and the like. As used herein, hydroxylamine is not an organic compound, and the boiling point and flash point of hydroxylamine and hydroxylamine derivatives are of no consequence to the formulation. It should be understood that hydroxylamine and its derivatives, as defined above, are available (and may be included in a composition according to the invention) as salts, e.g., sulfate salts, nitrate salts, or the like, or a combination thereof, and the invention includes these forms of hydroxylamine compounds and their derivatives. These salts greatly increase the theoretical flash point of hydroxylamine derivatives. Therefore, in another embodiment, the composition contains a hydroxylamine derivative, a sulfate or nitrate salt of hydroxylamine or a hydroxylamine derivative, or a combination thereof. Hydroxylamine is not desired in a subset of the formulations described herein. Therefore, in some embodiments, the composition according to the invention is substantially free from hydroxylamine and/or salts thereof.

Quaternary ammonium salts suitable for use as the nucleophilic amine compound of the invention can be represented by the following formula:

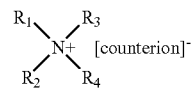

wherein $R_1$, $R_2$, $R_3$, and $R_4$ are independently hydrogen; optionally a substituted $C_1$–$C_6$ straight, branched or cyclic hydrocarbon group; optionally a substituted acyl group, straight or branched alkoxy group, amidyl group, carboxyl group, alkoxyalkyl group, alkylamino group, or alkylsulfonyl group, sulfonic acid group; or the salt of such compounds; and wherein the [counterion]⁻ may be a monovalent, divalent, trivalent, or tetravalent anion and is preferably a monovalent anion.

Examples of monovalent anions for use as a counterion to a quaternary ammonium salt according to the invention include, but are not limited to, hydroxyl groups, nitrate groups, bisulfite groups, bicarbonate groups, carboxylate groups having structures based on singly de-protonated carboxylic acid groups (e.g., formate, acetate, propionate, butyrate, isobutyrate, benzoate, naphthoate, or the like, or singly de-protonated forms of multiply protic carboxylic acids, such as lactate, ascorbate, glyconate, oxalate, malonate, fumarate, maleate, phthalate, isophthalate, terephthalate, gluconate, succinate, glutarate, tartrate, salicylate, glycerate, citrate, gallate, subgallate, or the like), or the like, or a combination thereof. If the counterion is a fluoride or a bifluoride and at least one of $R_1$, $R_2$, $R_3$, and $R_4$ is hydrogen, then the quaternary ammonium compound is more properly characterized as an HF-base salt. For a list of pKa's of various carboxylic acids and their relative likelihood of being mono-, di-, or tri-valent anions, see Table 1 below.

TABLE 1

|  | $pK_{a1}$ | $pK_{a2}$ | $pK_{a3}$ |
|---|---|---|---|
| Monobasic | | | |
| formic | 3.8 | | |
| acetic | 4.8 | | |
| propionic | 4.9 | | |
| n-butyric | 4.9 | | |
| isobutyric | 4.8 | | |
| benzoic | 4.2 | | |
| Dibasic | | | |
| ascorbic | 4.2 | 11.6 | |
| gluconic | 3.5 | 4.7 | |
| malic | 3.4 | 5.1 | |
| malonic | 2.8 | 5.7 | |
| oxalic | 1.3 | 4.3 | |
| succinic | 4.1 | 5.6 | |
| tartaric | 2.9 | 4.2 | |
| Tribasic | | | |
| citric | 3.1 | 4.8 | 6.9 |
| gallic | 4.2 | 8.9 | |

Hydrazines and hydrazine derivatives suitable for use as the nucleophilic amine compound of the present invention can be represented by the following formula:

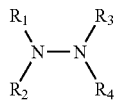

wherein $R_1$, $R_2$, $R_3$, and $R_4$ are independently hydrogen; a hydroxyl group; optionally a substituted $C_1$–$C_6$ straight, branched or cyclic hydrocarbon group; optionally a substituted acyl group, straight or branched alkoxy group, amidyl group, carboxyl group, alkoxyalkyl group, alkylamino group, alkylsulfonyl group, or sulfonic acid group; or single or multiple quaternary ammonium salts of such compounds.

In one embodiment, the nucleophilic amine compounds having reduction and oxidation potentials can include, or are interchangeable with alkanolamines. A preferred alkanolamine is a two carbon atom linkage alkanolamine. The generic two-carbon atom linkage alkanolamine compounds suitable for inclusion in the invention have the structural formula,

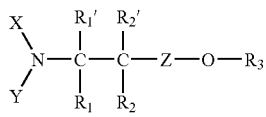

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula $-(-Q\text{-}CR_1R_1'\text{---}CR_2R_2'\text{---})_m\text{---}$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen, a $C_1$–$C_7$ linear, branched, or cyclic hydrocarbon, or a group having the formula $-CR_1R_1'-CR_2R_2'\text{-}Z\text{-}F$, with F being either $-O-R_3$ or $-NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring.

Examples of other two-carbon atom linkage alkanolamine compounds include, but are in no way limited to, DGA, 2-aminoethanol ("monoethanolamine" or "MEA"), 2-(N-methylamino)-ethanol ("monomethyl ethanolamine" or "MMEA"), 2-amino-1-propanol ("monoisopropanolamine" or "MIPA"), 2-(N-hydroxyethyl-amino)-ethanol ("diethanolamine" or "DEA"), 2-[(2-aminoethyl)-(2-hydroxyethyl)-amino]-ethanol ("N,N-bis-hydroxyethyl-ethylenediamine"), N,N,N-tris-(2-hydroxyethyl)-ammonia ("triethanolamine" or "TEA"), N-aminoethyl-N'-hydroxyethyl-ethylenediamine, N,N'-dihydroxyethyl-ethylenediamine, 2-[2-(2-aminoethoxy)-ethylamino]-ethanol, 2-[2-(2-aminoethylamino)-ethoxy]-ethanol, 2-[2-(2-aminoethoxy)-ethoxy]-ethanol, tertiarybutyldiethanolamine, isopropanolamine, diisopropanolamine, 3-amino-1-propanol ("n-propanolamine" or "NPA"), isobutanolamine, 2-(2-aminoethoxy)-propanol; 1-hydroxy-2-aminobenzene; or the like, or any combination thereof.

In a preferred embodiment, the composition contains a two-carbon atom linkage alkanolamine compound, in which m is greater than or equal to 1. In another preferred embodiment, the composition contains a two-carbon atom linkage alkanolamine compound, in which m is 1 and $R_1$, $R_1'$, $R_2$, $R_2'$, and $R_3$ are all hydrogen or a $C_1$–$C_4$ linear or branched hydrocarbon. In a more preferred embodiment, the composition contains a two-carbon atom linkage alkanolamine compound, in which: m is 1; $R_1$, $R_1'$, $R_2$, $R_2'$, and $R_3$ are all hydrogen or a $C_1$–$C_4$ linear or branched hydrocarbon; and Q is $-NR_3$. In a most preferred embodiment, the composition contains a two-carbon atom linkage alkanolamine compound, in which: m is 1; $R_1$, $R_1'$, $R_2$, $R_2'$, and $R_3$ are all hydrogen; X and Y are, independently, hydrogen or a linear or branched $C_1$–$C_4$ hydrocarbon; and Q is $-NH-$, $-NCH_3-$, or $-N[(C_2-C_4)$ linear or branched hydrocarbon]-.

One problem with prior art cleaning compositions is that the operating temperature was previously near or above the flash point of the composition mixture. For example, in the case of the monoethanolamine-catechol-dimethylacetamide-water compositions, as described in U.S. Pat. No. 5,988,186, the operating temperature was given as approximately 100° C., and in the case of monoethanolamine-catechol-hydroxylamine-water compositions described in U.S. Pat. No. 5,419,779, was approximately 90° C. In order to maintain safety, however, the operating temperature is advantageously restricted to about 10–15° C. below the flash point of the composition. The presently described compositions, having relatively high flash points in comparison to prior art compositions, allow more latitude in selecting an operating temperature within a safe range. Additionally, compounds with lower boiling points would be distilled from prior art compositions over time, resulting in off-specification cleaners, special make-up solutions, or both.

Many two-carbon atom linkage alkanolamine compounds have relatively low boiling points and relatively low flash points. The two carbon atom linkage alkanolamine compounds useful in the present invention preferably have relatively high boiling points (e.g., 185° C. or above, preferably 200° C. or above, alternately 215° C. or above) and preferably have relatively high flash points (e.g., 95° C. or above, preferably 100° C. or above, alternately 110° C. or above). Preferred specific examples of such two carbon atom linkage alkanolamine compounds include AEEA and 2-(2-aminoethoxy)-ethanol ("DGA"). AEEA, or N-hydroxyethyl-ethylenediamine, is the most preferred of the two carbon atom linkage alkanolamine compounds, though it may be admixed with other two carbon atom linkage alkanolamine compounds to achieve a particular result, such as increased etching or lower cost.

Advantageously, the formulations of the present invention can be stable for long periods of time, i.e., for at least 2 or 3 days, when exposed to normal operating or process conditions. By normal operating conditions we mean between about 50 and 100° C., for example between 60 and 75° C. By stable we mean the corrosion characteristics on various metal substrates is relatively unchanging. By stable we mean water can be added to the formulation, but is in some cases not added to the formulation. This requires the boiling points and/or the flash points of the components, e.g., the alkanolamines, be selected so that the formulation does not substantially change composition during use. High boiling point alkanolamines are, therefore, the preferred component to vary when tailoring the cleaner/etcher composition to a plurality of substrates.

In one embodiment, the composition according to the invention optionally contains a polar organic solvent. Examples of polar organic solvents for the composition according to the invention include, but are in no way limited to, dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidones such as N-methyl-2-pyrrolidone (NMP), sulfolanes, dimethylacetamide, dimethylsulfone, dimethylsulfolane, N,N-dimethylpropanamide, N,N-dimethylformamide, N,N-diethylformamide, dipropylene glycol alkyl ether, tripropylene glycol alkyl ether, ethylenediamine, N-substituted ethylenediamines, ethylenetriamine, N-substituted ethylenetriamines, or the like, or any combination thereof. Additional polar solvents as known in the art can also be used in the composition of the present invention. Dimethylsulfone, CAS No. 126-33-0, with a boiling point of 237° C., is preferred in some embodiments of the invention. NMP, with a boiling point of 199–202° C. and a flash point of only 96° C., may be useful in some embodiments because of low cost. Similarly, DMSO, with a boiling point of 189° C. and a flash point of only 95° C., is less preferred in some embodiments of the invention. 2,4-Dimethylsulfolane, with a boiling point of 280° C. and a flash point of 143° C., is preferred in some embodiments of the invention. Care must be taken because, in the absence of alkanolamines and the like, 2,4-dimethylsulfolane is only slightly miscible with water.

According to the present invention, amines, particularly alkanolamines and also particularly low molecular weight amines, are separate from, and are not classified as, a polar organic solvent. Other additional polar organic solvents as known in the art, other than those specifically excluded, can also be used in the composition of the present invention. In an alternate embodiment, the composition according to the invention is substantially free from polar organic solvents as defined herein.

Organic solvents, including polar organic solvents, that have a boiling point less than about 100° C. are undesirable in the composition according to the invention, as they tend to evaporate over a period of more than about 24–48 hours at operating conditions. Thus, it is preferred that the composition according to the invention be substantially free of organic solvents that have a boiling point less than about 100° C. It is more preferred that the composition according to the invention be substantially free of organic solvents that have a boiling point less than about 150° C. It is even more preferred that the composition according to the invention be substantially free of organic solvents that have a boiling point less than about 199° C.

In one embodiment, the compositions according to the invention optionally contain a corrosion inhibitor. In another embodiment, the composition according to the invention contains a single corrosion inhibitor, which is preferably EDTA (or a non-metallic salt thereof), gallic acid, or catechol. Catechol has a boiling point of 245° C., and a flash point of 127° C. The corrosion inhibitor can be resorcinol, with a boiling point of 281° C. and a flash point of 127° C. In another embodiment, the composition according to the invention contains a mixture of two corrosion inhibitors, preferably catechol and gallic acid. In another embodiment, the composition according to the invention contains a mixture of two corrosion inhibitors, preferably catechol and EDTA. In an alternate embodiment, the composition is substantially free from corrosion inhibitors.

Examples of corrosion inhibitors include, but in no way limited to, mono-, di-, or multi-hydroxybenzene-type compounds, e.g., such as catechol, resorcinol, butylated hydroxytoluene ("BHT"), and the like, or a combination thereof. In one embodiment, the corrosion inhibitors include three or more carboxylic acid-containing moieties, e.g., such as ethylenediamine tetraacetic acid ("EDTA"), non-metallic EDTA salts, and the like, or a combination thereof. Compounds containing a two carboxylic acid moieties, such as citric acid, are less preferred. Compounds containing both hydroxyl and carboxylic acid moieties, e.g., such as gallic acid and the like, are useful in one embodiment. Aromatic compounds containing thiol groups, e.g., such as thiphenol; amino-carboxylic acids; diamines, e.g., such as ethylene diamine; polyalcohols; polyethylene oxide; polyamines; polyimines; or a combination thereof, are useful in one embodiment. In one embodiment, two or more corrosion inhibitors can be used in one composition, where the corrosion inhibitors are selected from groups described above. Alternately or additionally, some corrosion inhibitors are described (sometimes as chelating agents) in U.S. Pat. No. 5,417,877, issued May 23, 1995 to Ward, and in commonly assigned U.S. Pat. No. 5,672,577, issued Sep. 30, 1997 to Lee, the disclosures of each of which are incorporated herein by reference.

Alternately, corrosion inhibitors useful in the composition of the invention can be hydroxybenzenes according to the formula:

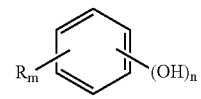

wherein n=1–4, m=2–5, and each $R_m$ is independently hydrogen, a substituted $C_1$–$C_7$ straight, branched or cyclic hydrocarbon group; a substituted acyl group, straight or branched alkoxy group, amidyl group, carboxyl group, alkoxyalkyl group, aklylamino group, alkylsulfonyl group, or sulfonic acid group, or the salt of such compounds. In one embodiment, the corrosion inhibitors can be dihydroxybenzene isomers and/or alkyl substituted dihydroxybenzenes. In this embodiment, the preferred corrosion inhibitors are 1,2-dihydroxybenzene and/or 1,2-dihydroxy-4-tert-butylbenzene.

Additional corrosion inhibitors as known in the art can also be used in the composition of the present invention. For example, corrosion inhibitors which are metal-ion-free can be utilized, such as thiophenol or its derivatives according to the formula:

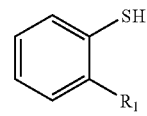

where $R_1$ is preferably a hydrogen, hydroxyl, or carboxylic acid group; or an ethylenediamine tetracarboxylic acid (EDTC), or a salt thereof, having the formula:

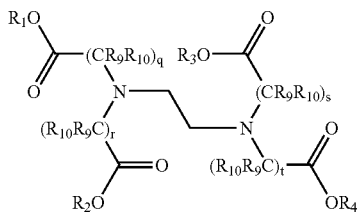

wherein $R_1$, $R_2$, $R_3$ and $R_4$ can be either H, or $NR_5R_6R_7R_8$, where $R_5$, $R_6$, $R_7$, and $R_8$ are each independently hydrogen or a linear or branched $C_1$–$C_6$ hydrocarbon, or where two or more of $R_5$, $R_6$, $R_7$, and $R_8$ together form a heterocyclic $C_4$–$C_7$ ring; wherein $R_9$ and $R_{10}$ may be independently defined in each repeat unit and each of which are independently hydrogen or a linear or branched $C_1$–$C_6$ hydrocarbon, and wherein each of q, r, s, and t is a whole number from 0 to 4 (i.e., when q, r, s, or t=0, there is no atom between the nitrogen and the —COOH group in the formula above). As evident from the above formula, the EDTC can be mono-, di- or tri-substituted rather than tetra-substituted. For example, when each of q, r, s, and t are 1, when each $R_9$ and $R_{10}$ is a hydrogen, and when each $R_1$, $R_2$, $R_3$ and $R_4$ are all hydrogens, the EDTC above is ethylenediamine tetraacetic acid (EDTA). Metal salts are not believed to be suitable for use, based upon the understood mechanism of ionic contamination in a microcircuit as caused by cleaning, as the compositions according to the invention are preferably free of metals/metal ions.

Additional suitable corrosion inhibitors include tetraalkyl ammonium hydroxides which can be represented by the formula $R_1R_2R_3R_4N^+OH^-$ wherein $R_1$, $R_2$, $R_3$, and $R_4$ are short chain alkyl groups, preferably having from 1 to 6 carbon atoms, and wherein $R_1$, $R_2$, $R_3$, and $R_4$ can be the same or different. One preferred tetraalkyl ammonium hydroxide is tetramethylammonium hydroxide.

In one embodiment, the compositions according to the invention optionally contain a corrosion inhibitor. In another embodiment, the composition according to the invention contains a single corrosion inhibitor, which is preferably choline hydroxide, bischoline hydroxide, or trischoline hydroxide. In an alternate embodiment, the composition according to the invention is substantially free from corrosion inhibitors.

Examples of corrosion inhibitors include, but are not limited to, nitrate salts of ammonium; hydrocarbon-substituted ammonium nitrate salts; benzotriazole; 2,4-pentandione dioxime; 1,6-dioxaspiro[4,4]nonane 2,7-dione (diether); thiourea; ammonium bisulfite; choline bisulfite; bischoline bisulfite; trischoline bisulfite; choline hydroxide; bischoline hydroxide; trischoline hydroxide; glycerol; sorbitol; gelatine; starch; phosphoric acid; silicic acid; polyethylene oxide; polyethylene imine; and the like; or a combination thereof. Preferably, the corrosion inhibitors are substantially free of metals and/or metal ions.

Certain quaternary ammonium salt compounds can be categorized as either corrosion inhibitors or nucleophilic amines having reduction and oxidation potentials. In a case when a quaternary ammonium salt compound is present in the composition and a nucleophilic amine having a reduction and oxidation potential (i.e., besides a different quaternary ammonium salt compound) is already present, it is preferred that the quaternary ammonium salt compound be categorized as a corrosion inhibitor. In a case when a quaternary ammonium salt compound is present in the composition and a corrosion inhibitor (i.e., besides a different quaternary ammonium salt compound) is already present, it is preferred that the quaternary ammonium salt compound be categorized as a nucleophilic amine having reduction and oxidation potentials. In a case when a quaternary ammonium salt compound is present in the composition and both a corrosion inhibitor (i.e., besides a different quaternary ammonium salt compound) and a nucleophilic amine having a reduction and oxidation potential (i.e., besides a different quaternary ammonium salt compound) are already present, the quaternary ammonium salt compound may be categorized as either a corrosion inhibitor or a nucleophilic amine having reduction and oxidation potentials. When more than one quaternary ammonium salt compound is present in the composition, it is preferred that all the quaternary ammonium salt compounds are categorized in the same group, whether that be as corrosion inhibitors or as nucleophilic amines having reduction and oxidation potentials.

In one embodiment, the compositions according to the invention optionally contain a salt of hydrofluoric acid and a base that is substantially free from metal ions (hereinafter "HF-base salt," without intent to limit). Examples of HF-base salts include, but are in no way limited to, ammonium fluoride, diisopropylethylammonium fluoride, ammonium bifluoride, pyridinium fluoride, and the like, or a combination thereof In one embodiment, the HF-base salt includes diisopropylethylammonium fluoride or ammonium fluoride. Such compositions advantageously include a two-carbon atom linkage alkanolamine compound, a corrosion inhibitor, and optionally a polar organic solvent. Most formulation described herein are preferably free of fluoride ions, however, so, in an alternate embodiment, the composition according to the invention is substantially free from HF-base salts. As used herein, ammonium fluorides or bifluorides, or substituted ammonium fluorides or bifluorides containing at least one N—H bond, may only be characterized as HF-base salts and not as quaternary ammonium salt compounds, as described above.

In one embodiment, the composition according to the invention optionally contains water. Water is preferred in a majority of residue removing compositions. Additionally, hydroxylamine is commercially available in an aqueous, i.e., a 50% aqueous, solution. Hydroxylamine derivatives are typically available in more concentrated aqueous forms, for example as 85% solutions with 15% water. However, hydroxylamine and/or hydroxylamine derivatives can be obtained or manufactured, in some instances and in some concentrations, in a water-free formulation. For example, anhydrous N,N-diethylhydroxyl-amine is available from Sigma-Aldrich of Milwaukee, Wis. As described above, in an alternate embodiment, the composition according to the invention can be substantially free from water.

In practice, it appears that, when present, the corrosion inhibitor (particularly in the form of an EDTC, catechol, or gallic acid) enhances the ability of the two carbon atom linkage alkanolamine compound to remove the residue. At the same time, when present, the EDTC, catechol, gallic acid, or other corrosion inhibitor can help to prevent attack on the metal or metal alloy substrate, e.g., copper.

In one embodiment, the composition according to the invention also contains a surfactant. Examples of surfactants include, but are in no way limited to, sodium laurel sulfate, sodium stearate, and the like, or a combination thereof.

In one embodiment, the compositions according to the invention contain a two-carbon atom linkage alkanolamine compound in an amount from about 1% to about 98%, alternately from about 5% to about 90%, from about 10% to about 85%, from about 20% to about 80%, or from about 30% to about 70%.

When present, the amount of corrosion inhibitor in the composition according to the invention can advantageously be from about 0.01% to about 15%, preferably from about 0.1% to about 10%, for example, from about 2% to about 5%, or alternately from about 0.01% to about 0.1%.

Advantageously, the amount of hydroxylamine derivatives (including hydroxylamine, when present) in the composition according to the invention can be from about 0.1% to about 50%, preferably from about 1% to about 30%, alternately from about 5% to about 20%, for example from about 1% to about 10% or from about 10% to about 20%.

Alternately, the composition according to the invention can advantageously contain from about 10 millimoles to about 560 millimoles of hydroxylamine derivative(s) (not including hydroxylamine, when present), preferably from about 10 millimoles to about 350 millimoles, alternately from about 55 millimoles to about 225 millimoles, for example from about 10 millimoles to about 110 millimoles or from 110 millimoles to about 225 millimoles.

When present, the amount of hydroxylamine in the composition according to the invention can be expressed in a ratio, relative to the amount of hydroxylamine derivative(s) present in the composition according to the invention. In one embodiment, the hydroxylamine:hydroxylamine derivative weight ratio can be from about 1:20 to about 20:1, alternately from about 1:20 to about 1:1 or from about 1:1 to about 1:20, for example from about 1:5 to about 1:1 or from about 1:1 to about 1:5. In another embodiment, the hydroxylamine:hydroxylamine derivative molar ratio can be from about 1:54 to about 8:1, alternately from about 1:54 to about 1:2.7 or from about 1:2.7 to about 8:1, for example from about 1:13.5 to about 1:2.7 or from about 1:2.7 to about 1.9:1.

When present, the amount of water in the composition according to the invention can advantageously be from about 1% to about 50%, preferably from about 2% to about 45%, for example from about 5% to about 40% or from about 15% to about 35%, alternately from about 2% to about 15% or from about 1% to about 10%.

When present, the amount of polar organic solvent in the composition according to the invention can advantageously be from about 1% to about 75%, for example from about 5% to about 50%, or alternately from about 0.1% to about 45%, for example from about 2% to about 30%.

When present, the amount of HF-base salt in the composition according to the invention can advantageously be from about 0.01% to about 20%, for example, from about 0.1% to about 5%, or alternately from about 1% to about 10%.

When present, the amount of surfactant in the composition according to the invention can advantageously be from about 0.01% to about 10%, for example, from about 0.1% to about 5%, or alternately from about 1% to about 10%.

Preferably, all of the compositions according to the invention have very low metal impurity/ion contents, e.g., less than about 10 ppm total. In a preferred embodiment, the compositions according to the invention have less than about 5 ppm total metal content, preferably not more than about 1 ppm total metal impurity and metal ion content.

The residue cleaning compositions of the present composition are effective in removing organometallic and selected metal oxide residue, as well as photoresists and residue therefrom, from a variety of integrated circuit constructs on substrates, e.g.: silicon; SiGe; Group III–V compounds, such as GaAs; Group III–VI compounds, such as TeS; magnetic materials, such as NiFe; glasses, such as used, for example in flat panel displays; or any combination thereof, especially those substrates including: metal and/or metal alloy layers, optionally with via holes features for interconnect, such as layers containing aluminum, titanium, copper, and/or tungsten; oxide layers, such as silicon oxides; nitride layers, such as silicon nitride; polymer substrates or layers, such as photoresist layers, polycarbonate substrates, etc.; and the like; or any combination thereof. The cleaning compositions of the present invention are also effective in removing organometallic and metal oxide residue generated on the substrate of etching equipment utilized in the fabrication of integrated circuits. Examples of commercially available etching equipment include that available from Lam Research, Tegal, Electrotech, Applied Materials, Tokyo Electron, Hitachi, and the like.

It has been found that in formulations containing a two-carbon atom linkage alkanolamine compound and one or more of: polar organic solvents, water, an amine, other alkanolamines, chelators, and corrosion inhibitors provide excellent removal of etch residue from copper and copper alloy substrates with low, commercially acceptable rates of etching. Beneficially, in one embodiment, the formulations are substantially free of hydroxylamine. Hydroxylamine in many formulations is aggressive to copper. In some embodiments, the use of hydroxylamine derivatives, in which alkyl groups may partially shield the functional group(s), can be advantageous, especially if combined with two-carbon atom linkage alkanolamine compounds and one or more of water, polar organic solvents, corrosion inhibitors (e.g., benzotriazole, which is well-known for its non-aggressiveness toward copper layers), and the like.

In one embodiment, especially when the substrate has a titanium layer from which residue is to be removed, the above compositions can advantageously contain, in one embodiment: a two-carbon atom linkage alkanolamine compound content (e.g., a DGA content) of at least about 40% by weight, alternately from about 40% to about 80% by weight; a hydroxylamine derivative content (e.g., a DEHA content) from about 1% to about 30% by weight, alternately from about 5% to about 25% by weight; and a corrosion inhibitor content (e.g., a gallic acid or catechol content, or a combination thereof) from about 0.1% to about 15% by weight, alternately from about 2% to about 10% by weight; a water content from 0% to about 50% by weight, alternately from about 10% to about 40% by weight, in order for the composition to exhibit an acceptably low etch rate.

In another embodiment, especially when the substrate has a titanium layer from which residue is to be removed, the above compositions can advantageously contain, in an alternate embodiment: a water content from about 0% to about 39% by weight, alternately from about 10% to about 39% by weight; a hydroxylamine derivative content (e.g., a DEHA content) from about 1% to about 19% by weight, alternately from about 5% to about 19% by weight; a two-carbon atom linkage alkanolamine compound content (e.g., a DGA content) from about 20% to about 80% by weight, alternately from about 30% to about 70% by weight; and a corrosion inhibitor content (e.g., a gallic acid or catechol content, or a combination thereof) from about 0.1% to about 15% by weight, alternately from about 2% to about 10% by weight, in order for the composition to exhibit an acceptably low etch rate.

In one embodiment, especially when the substrate has a copper layer from which residue is to be removed, the above compositions can advantageously contain, in one embodiment: a two-carbon atom linkage alkanolamine compound content (e.g., a DGA content) of not more than 51.0% by weight, alternately from about 20% to 51.0% by weight; a hydroxylamine derivative (e.g., DEHA) from about 1% to about 30% by weight, alternately from about 5% to about 25% by weight; a water content from 0% to about 50% by weight, alternately from about 10% to about 40% by weight; and a corrosion inhibitor content (e.g., a gallic acid or catechol content, or a combination thereof) from about 0.1% to about 15% by weight, alternately from about 2% to about 10% by weight, as well as being substantially (or completely) free from hydroxylamine, in order for the composition to exhibit an acceptably low etch rate.

In another embodiment, especially when the substrate has a copper layer from which residue is to be removed, the above compositions can advantageously contain, in an alternate embodiment: a corrosion inhibitor content (e.g., a gallic acid or catechol content, or a combination thereof) from about 6% to about 15% by weight, alternately from about 6% to about 10% by weight; a water content from 0% to about 50% by weight, alternately from about 10% to about 40% by weight; a hydroxylamine derivative (e.g., DEHA) from about 1% to about 30% by weight, alternately from about 5% to about 25% by weight; and a two-carbon atom linkage alkanolamine compound content (e.g., a DGA content) from about 20% to about 80% by weight, alternately from about 30% to about 70% by weight, as well as being substantially (or preferably completely) free from hydroxylamine, in order for the composition to exhibit an acceptably low etch rate.

In another embodiment, especially when the substrate has a copper layer from which residue is to be removed, the above compositions can advantageously contain, in another alternate embodiment: a corrosion inhibitor content (e.g., a gallic acid or catechol content, or a combination thereof) of less than 5% by weight, alternately from about 1% to about 4% by weight; a water content from 0% to 31% by weight, alternately from about 10% to about 31% by weight; a two-carbon atom linkage alkanolamine compound content (e.g., a DGA content) from about 20% to about 80% by weight, alternately from about 30% to about 70% by weight; and a hydroxylamine derivative content (e.g., a DEHA content) from about 1% to about 15% by weight, alternately from about 8% to about 15% by weight, as well as being substantially (or preferably completely) free from hydroxylamine, in order for the composition to exhibit an acceptably low etch rate.

In yet another embodiment, especially when the substrate has a copper layer from which residue is to be removed, the above compositions can advantageously contain, in another alternate embodiment: a water content of greater than 25% by weight, alternately from about 26% to about 50% by weight; a hydroxylamine derivative content (e.g., a DEHA content) of greater than about 15% by weight, alternately from about 15% to about 30% by weight; a two-carbon atom linkage alkanolamine compound content (e.g., a DGA content) from about 20% to about 80% by weight, alternately from about 30% to about 70% by weight; and a corrosion inhibitor content (e.g., a gallic acid or catechol content, or a combination thereof) from about 0.1% to about 15% by weight, alternately from about 1% to about 10% by weight, as well as being substantially (or preferably completely) free from hydroxylamine, in order for the composition to exhibit an acceptably low etch rate.

In still another embodiment, especially when the substrate has a copper layer from which residue is to be removed, the above compositions can advantageously contain, in one embodiment: a two-carbon atom linkage alkanolamine compound content (e.g., a DGA content) of not less than 50.0% by weight, alternately from about 10% to 50.0% by weight; a hydroxylamine derivative content (e.g., a DEHA content) of greater than about 11% by weight, alternately from about 11% to about 30% by weight; a water content from about 0% to about 50% by weight, alternately from about 10% to about 50% by weight; and a corrosion inhibitor content (e.g., a gallic acid or catechol content, or a combination thereof) from about 0.1% to about 15% by weight, alternately from about 1% to about 10% by weight, as well as being substantially (or preferably completely) free from hydroxylamine, in order for the composition to exhibit an acceptably low etch rate.

In one embodiment, especially when the substrate has an aluminum layer from which residue is to be removed, the above compositions can advantageously contain, in an alternate embodiment: a water content of less than about 30% by weight, alternately from about 5% to about 30% by weight; a two-carbon atom linkage alkanolamine compound content (e.g., a DGA content) from about 20% to about 80% by weight, alternately from about 30% to about 70% by weight; a corrosion inhibitor content (e.g., a gallic acid or catechol content, or a combination thereof) from about 0.1% to about 15% by weight, alternately from about 1% to about 10% by weight; and a hydroxylamine derivative content (e.g., a DEHA content) from about 1% to about 30% by weight, alternately from about 5% to about 25% by weight, as well as being substantially (or preferably completely) free from hydroxylamine, in order for the composition to exhibit an acceptably low etch rate.

In another embodiment, especially when the substrate has an aluminum layer from which residue is to be removed, the above compositions can advantageously contain, in another alternate embodiment: a corrosion inhibitor content (e.g., a gallic acid or catechol content, or a combination thereof) from about 1% to about 6% by weight, a water content of less than 35% by weight; a water content from about 0% to about 50% by weight, alternately from about 10% to about 50% by weight; a two-carbon atom linkage alkanolamine compound content (e.g., a DGA content) from about 20% to about 80% by weight, alternately from about 30% to about 70% by weight; and a hydroxylamine derivative content (e.g., a DEHA content) from about 11% to about 18% by weight, alterantely from about 12% to about 17%, as well as being substantially (or preferably completely) free from hydroxylamine, in order for the composition to exhibit an acceptably low etch rate.

Another aspect of the invention relates to a method of cleaning a substrate using the compositions of the present invention, which method involves contacting a substrate having organometallic and/or metal oxide residue thereon with a stripping and cleaning composition for a time and at a temperature sufficient to remove the residue. In one preferred embodiment, the residue is removed with no observable etching to the substrate, that is, with etch rates less than about 1 angstrom per minute of immersion at the operating conditions.

In one embodiment, the substrate can be immersed in the composition according to the invention. In some cases, when a production line progress is temporarily interrupted, those substrates exposed to the residue removers of the present invention with the resultant very low etch rates can be salvaged, while those substrates immersed in more aggressive formulations are destroyed.

In an alternate embodiment, the composition according to the invention can be applied to a surface of the substrate, e.g., by spraying on, applying droplets, coating, overcoating (with the excess composition running off the substrate), or the like, or a combination thereof. The low flash point and vapor pressure of the preferred compositions of this invention allow this type of application without resulting in unacceptable evaporation and vapors.

In either embodiment, the time and temperature of the contact between the composition and the substrate layer(s) can be determined based on the particular material being removed from a substrate. Generally, the useful temperature is in the range of from about ambient or room temperature to about 100° C. and the contact time is typically from about 2 to about 60 minutes. However, the temperature range may expand to higher temperatures, especially when the flash point of the two-carbon atom linkage alkanolamine compound(s) are relatively high, as is the case when, e.g., AEEA and/or DGA are included in the composition according to the invention.

In some embodiments the flash point of a formulation is above the flash point of the component in the formulation with the lowest flash point, particularly if that component is freely miscible and is present in a minor quantity. It is possible to use selected compositions of this invention at temperatures between about 101° C. and about 160° C., for example between about 115° C. and about 150° C., alternatively from about 115° C. to about 135° C. These higher temperatures can be used at atmospheric pressure and, of course, at superatmospheric pressure. The compositions allow use of the higher temperatures from a technical standpoint and also allow use of the compositions from a regulatory standpoint. Regulations generally become more stringent as operating temperatures approach a predetermined fraction of the flash point.

The component with a boiling point below 150° C. in selected preferred compositions, and which is also the component which is most volatile at operating temperatures, is water. Water can be easily replenished to the solution, and water does not present a safety hazard.

The components with a boiling point below 150° C. in other selected preferred compositions, which are most volatile at operating temperatures, are hydroxylamine and water. Water and hydroxylamine can be easily replenished to the solution, and this replentishing solution does not present a significant fire hazard.

Especially in cases where one or more components (e.g., such as water, solvent, a two-carbon atom linkage alkanolamine compound, or the like), or a portion thereof (e.g., such as the base of the HF-base salt or the like), of the compositions according to the invention evaporates (and/or degrades) significantly after prolonged exposure to operating conditions, a replenishing solution may be combined with the original composition according to the invention to at least partially replenish the evaporated (and/or degraded) component(s) (and/or portion(s)) of the original composition.

In a preferred embodiment where the original composition contains water, the replenishing composition contains water. In another preferred embodiment where the original composition contains polar organic solvent, the replenishing composition can contain polar organic solvent. The replenishing compositions according to the invention may optionally also contain, as necessary and where the original composition contained one or more of these components (or a portion thereof), at least one of the following: a nucleophilic amine according to the invention, a base of the HF-base salt, a corrosion inhibitor and/or a corrosion inhibitor, hydroxylamine or a hydroxylamine derivative, a surfactant, a non-hydroxyl-containing amine compound, and any combination thereof.

Advantageously, the replenishing solutions of many embodiments of the present invention contain only water and optionally hydroxylamine or hydroxylamine derivative. Advantageously, the replenishing solutions of this embodiment are substantially free of polar organic solvents, alkanolamines, corrosion inhibitors, and chelators. Of course, if a replenishing solution contains both the residue remover (to make up that which is for example lost in the wash) and additional compounds, then for purposes of this disclosure the replenishing solution contains only the additional ingredients.

The replenishing solutions of many embodiments of the present invention contain only water, optionally hydroxylamine or hydroxylamine derivative, and a corrosion inhibitor and/or corrosion inhibitor. Advantageously, the replenishing solutions of this embodiment are substantially free of polar organic solvents and alkanolamines. Of course, if a replenishing solution contains both the residue remover (to make up that which is lost for example in the wash) and additional compounds, then for purposes of this disclosure the replenishing solution contains only the additional ingredients.

The replenishing solutions of many embodiments of the present invention contain water, a nucleophilic amine compound according to the invention, optionally hydroxylamine or a hydroxylamine derivative, and optionally a corrosion inhibitor and/or corrosion inhibitor. When both the original composition according to the invention and the replenishing composition contain a nucleophilic amine compound and water, it is preferred that the nucleophilic-amine-compound:water ratio in the replenishing composition be not more than about 90%, preferably not more than about 75%, more preferably not more than about 50%, of the nucleophilic-amine-compound:water ratio in the original composition. That is, if there is 20% nucleophilic amine compound and 20% water in the original residue remover, then advantageously the replenishing solution has a weight ratio of nucleophilic-amine-compound:water of not more than about 0.9:1, preferably not more than about 0.75:1, more preferably not more than about 0.5:1. The replenishing solutions are therefore less expensive than prior art replenishing formulations, which typically contained a greater ratio of nucleophilic amine compounds to water than was present in the original residue remover. Advantageously, the replenishing solutions of this embodiment can be substantially free of polar organic solvents. Of course, if a replenishing solution contains both the residue remover (to make up that which is lost for example in the wash) and additional compounds, then for purposes of this disclosure the replenishing solution contains only the additional ingredients.

Generally, the most prevalent component(s) (or portion(s) thereof) present in the replenishing compositions are those which have relatively low vapor pressures at operating temperatures, or those which have relatively low boiling points, at least in comparison to the other components of the original composition according to the invention.

As a result, in another embodiment, the replenishing composition can advantageously contain less than about 20% of, preferably can contain less than about 10% of, more preferably can contain less than about 5% of, alternately can be substantially free from, any component(s) (besides water) that has a boiling point of less than about 185° C., preferably less than about 200° C., alternately less than about 215° C., and that has a flash point of less than about 95° C., preferably less than about 100° C., alternately less than about 110° C.

After treatment with the compositions of this invention, the substrate may then be rinsed in a low-boiling-point polar organic solvent, such as isopropyl alcohol or N-methylpyrrolidone, or in a mildly acidic organic acid solution, such as acetic or citric acid, followed by a deionized water rinse. Alternately, the substrate may be merely rinsed with a very dilute solution of a carboxylic acid and deionized water, or even just with deionized water, especially if the composition according to the invention is substantially free of other alkanolamines and/or other alcohol amines.

That is, after treatment with the compositions of this invention, the substrate may then be rinsed in a low molecular weight polar solvent, such as isopropyl alcohol, followed by a deionized water rinse. Alternately, the substrate may then be rinsed in a mildly acidic organic acid solution, such as acetic or citric acid in water or water/alcohol, followed by a deionized water rinse. Alternately and advantageously, the substrate may be merely rinsed with deionized water. Advantageously, the residue removing composition is substantially free of polar organic solvents, corrosion inhibitors, organic solvents (polar or non-polar), and corrosion inhibitors which are not readily miscible with water. This allows eliminating the low boiling temperature solvent rinse, which is a substantial advantage in semiconductor manufacture.

After being rinsed, the substrate can then be mechanically dried, such as with a spin drier, or nitrogen blow dried. Alternately or additionally, the substrate may be allowed to at least partially air dry and/or may be nominally heated.

Another aspect of the invention relates to a method of etching, and optionally cleaning, a substrate using the compositions of the present invention, which method involves contacting a substrate comprising a metal or metal alloy to be etched, and optionally having organometallic and/or metal oxide residue thereon, with the composition according to the invention for a time and at a temperature sufficient to selectively etch the metal or metal alloy, and optionally remove the residue. In extreme etching situations, the etching formulation can advantageously contain an abrasive, or alternatively the substrate can be contacted with a rubbing surface having an abrasive thereon.

The etch rate of the metal or metal alloy can be advantageously tailored by selecting an appropriate two-carbon atom linkage alkanolamine compound or mixture thereof, based on the metal or metal alloy to be etched. For example, with an aluminum-, copper-, or titanium-containing substrate, a relatively low etch rate can be obtained in most embodiments of this invention with the two-carbon atom linkage alkanolamine compound being only AEEA and/or with the hydroxylamine derivative being only DEHA, whereas the etch rate can be incrementally increased by maintaining: the same total percentage of two-carbon atom linkage alkanolamine compound, but by incrementally decreasing the proportion of AEEA with respect to, e.g., DGA; or the same total percentage of hydroxylamine derivative, but by incrementally decreasing the proportion of DEHA with respect to, e.g., hydroxylamine.

In one embodiment, the substrate can be immersed in the composition according to the invention. In an alternate embodiment, the composition according to the invention can be applied to a surface of the substrate, e.g., by spraying on, applying droplets, coating, overcoating (with the excess composition running off the substrate), or the like, or a combination thereof. In some etching situations, the etching formulation can advantageously contain an abrasive and be contacted with a smooth surface, or alternatively the substrate can be contacted with a rubbing surface having an abrasive thereon.

In either embodiment, the time and temperature are determined based on the particular material being removed from a substrate. Generally, the temperature is in the range of from about ambient or room temperature to about 120° C. and the contact time is typically from about 2 to about 60 minutes. However, the temperature range may expand to higher temperatures, especially when the flash point of the two-carbon atom linkage alkanolamine compound(s) are relatively high, as is the case when, e.g., AEEA and/or DGA are included in the composition according to the invention.

EXAMPLES

Examples illustrating the removal of etching residue from a substrate are set forth below. The following examples are provided to further illustrate the present invention and are not intended to limit the scope of the present invention.

In the examples, the substrate is treated in conventional known manners prior to the treatment of the substrate with the compositions of the present invention.

Examples of cleaning compositions according to the present invention utilized in Examples 1–15 below for removing etching residue from a substrate are set forth in Table II below.

TABLE II

| Cleaning Composition | Hydroxylamine Wt. % | Organic Solvent Wt. % |
|---|---|---|
| A | 25% | 50% 2-Amino-2-Ethoxy Ethanol |
| B | 20% | 60% 2-Amino-2-Ethoxy Ethanol |
| C | 20% | 55% 2-Amino-2-Ethoxy Ethanol |
| D | 17.5% | 50% Monoethanolamine |
| E | 8.75% | 30% 2-Aimino-2-Ethoxy Ethanol |
| F | 15% | 60% Monoethanolamine |
| G | 15% | 70% 2-Amino-2-Ethoxy Ethanol |

| Cleaning Composition | Water Wt. % | 1,2-dihydroxybenzene Wt. % |
|---|---|---|
| A | 25% | 0% |
| B | 20% | 0% |
| C | 20% | 5% |
| D | 17.5% | 15% |
| E | 63.5% | 2.5% |
| F | 20% | 5% |
| G | 15% | 0% |

Example 1

Figure 1:
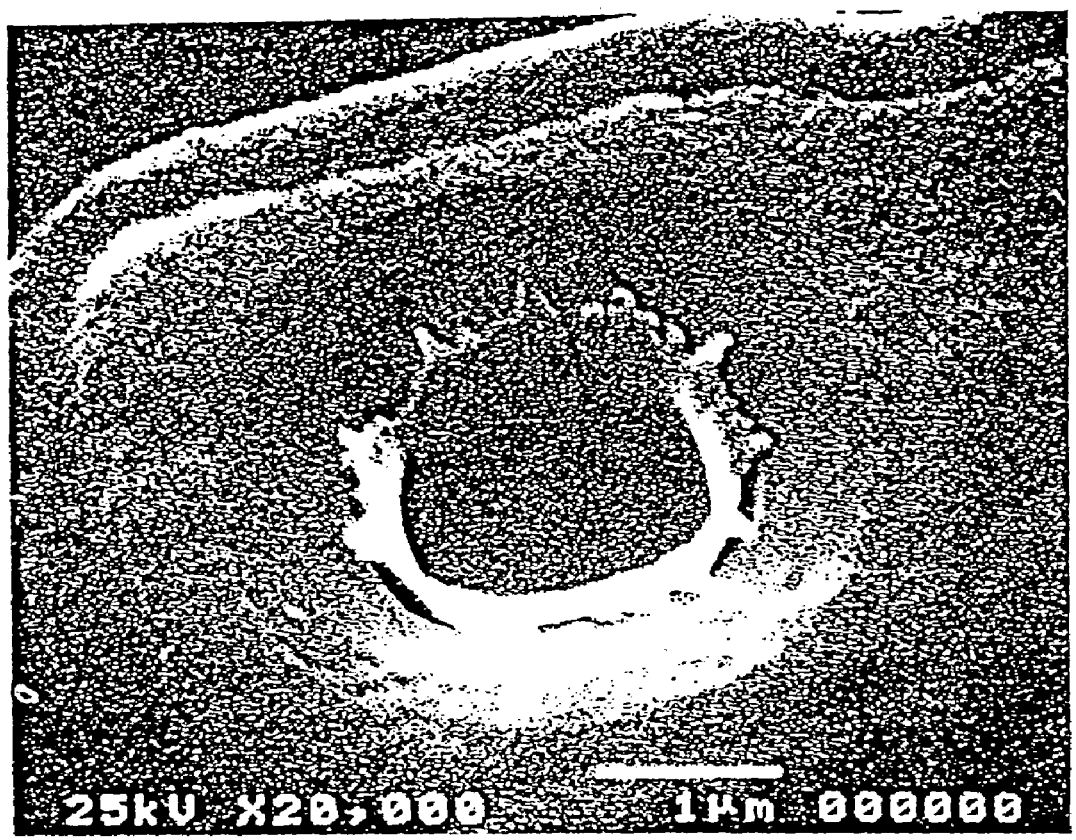
FIG. 1 shows etched wafer residue following the use of plasma ashing to remove a resist from a silicon oxide dielectric layer which had been earlier plasma etched.
Figure 2:
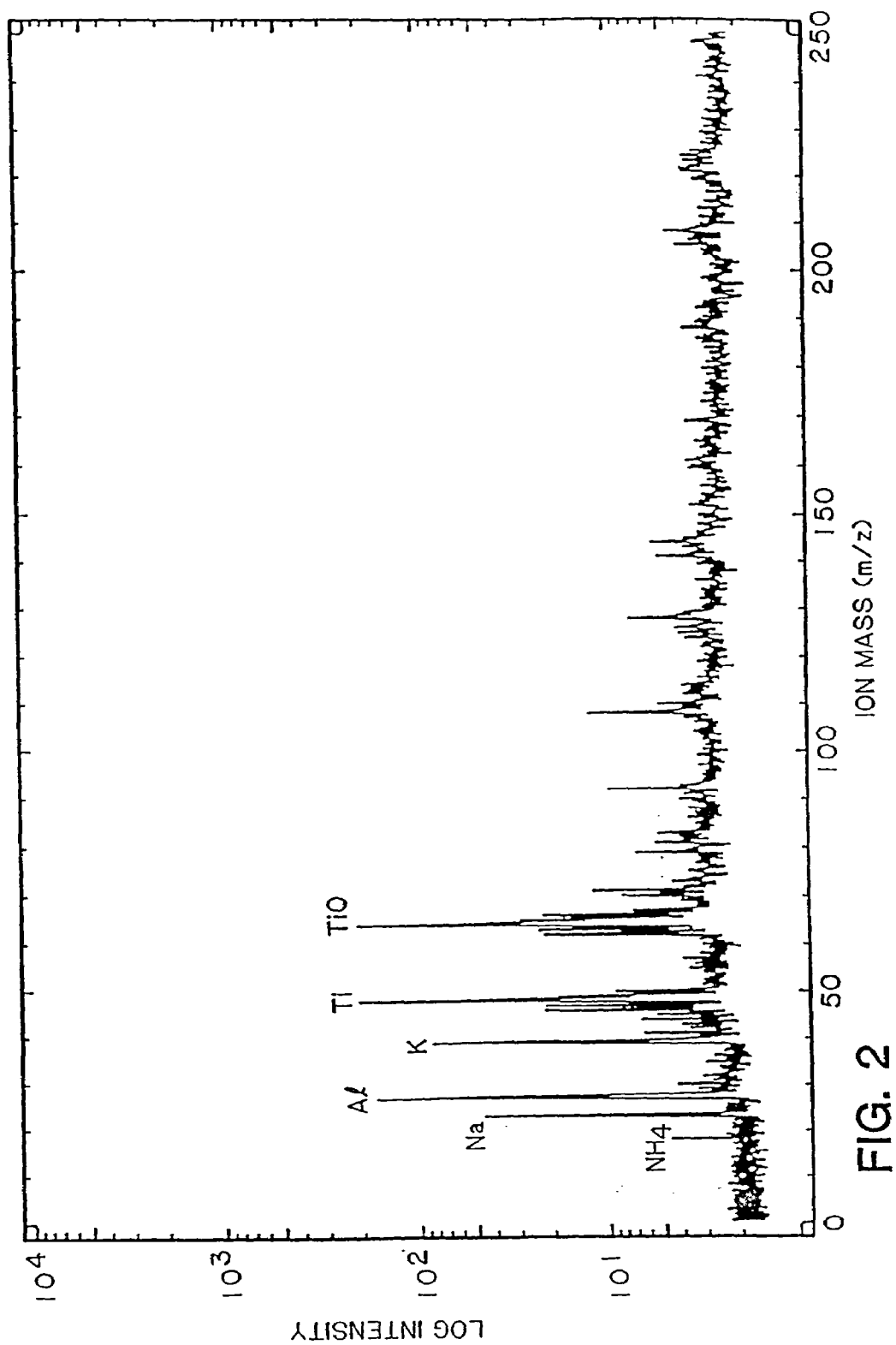
FIG. 2 shows the results of an analysis using ion mass spectrometry (LII4A) of the residue shown in FIG. 1. Such analysis indicates that the residue contains metal oxide and trace amounts of organic material.

Example 1 illustrates the problem of residue remaining on a wafer substrate following plasma etching and ashing. FIG. 1 shows etched wafer residue present on an etched substrate following plasma ashing. Specifically, silicon oxide used as a dielectric layer has a pattern etched for a multi-layer interconnect according to a standard plasma etching process. A photoresist which was used as a masking material has already been removed by oxygen plasma ashing. Analysis of the residue present on the etched wafer was analyzed by ion mass spectrometry (LIMA). The results of the analysis are as shown in FIG. 2. The analysis confirms that the residue contains metal oxide and trace amounts of organic material.

Example 2

Example 2 illustrates the effect of the cleaning composition of the present invention on a wafer as determined by C/V testing. C/V shift measurement is a means utilized to determine the effect of a chemical used to clean a wafer. A high voltage shift is mainly caused by mobile ion contamination to the wafer. Such contamination will adversely affect subsequent process steps and may eventually cause failure of the microcircuits.

The test evaluation compares the C/V shift of different conventional photoresist stripping compositions to the cleaning composition of the present invention. All wafers used were known to be good silicon oxide substrates. All chemicals were heated on a hot plate to the manufacturers' suggested operating temperature using a pyrex beaker. Each of the beakers utilized was new and had not been previously used in any chemical processing. Individual beakers were used for each product. After immersing the silicon oxide wafer in the described composition, the wafers were rinsed and dried. Table III sets forth the operating conditions and the results of the C/V shift test.

TABLE III

| Composition/Product | Manufacturer | U.S. Pat. No. | Process Conditions | Results |
|---|---|---|---|---|
| PRS-3000 | J. T. Baker | 4,403,029 | 90° C./20 min. | +15.624 volts |
| EMT 300 | ENT | 4,770,713 | 90° C./20 min. | +2.440 volts |
| N-Methyl-2-Pyrrolidone | J. T. Baker | 4,295,479 | 90° C./20 min. | +2.044 volts |
| Nophenol 944 | EKC | 4,395,384 | 100° C./20 min. | −0.368 volts |
| Composition C | — | — | 65° C./20 min. | +0.221 volts |
| Control | — | — | — | −0.576 volts |

A negative reading means no change in C/V shift. The cleaning Composition C, according to the present invention as described above, was shown to provide a cleaner surface than any of the positive photoresist strippers tested.

Example 3

Figure 3A:
FIGS. 3A and 3B show the results of a comparison test utilizing a cleaning composition of the present invention (FIG. 3A) and a stripping composition as described in U.S. Pat. No. 4,403,029 (FIG. 3B) in relation to a silicon oxide dielectric layer containing etching residue thereon which is present following removal of a resist by plasma ashing. By comparing FIG. 3A with FIG. 3B, it can be seen that all the organometallic residue was removed using the composition of the present invention while residue remained following use of the stripping composition described in U.S. Pat. No. 4,403,029.
Figure 3B:
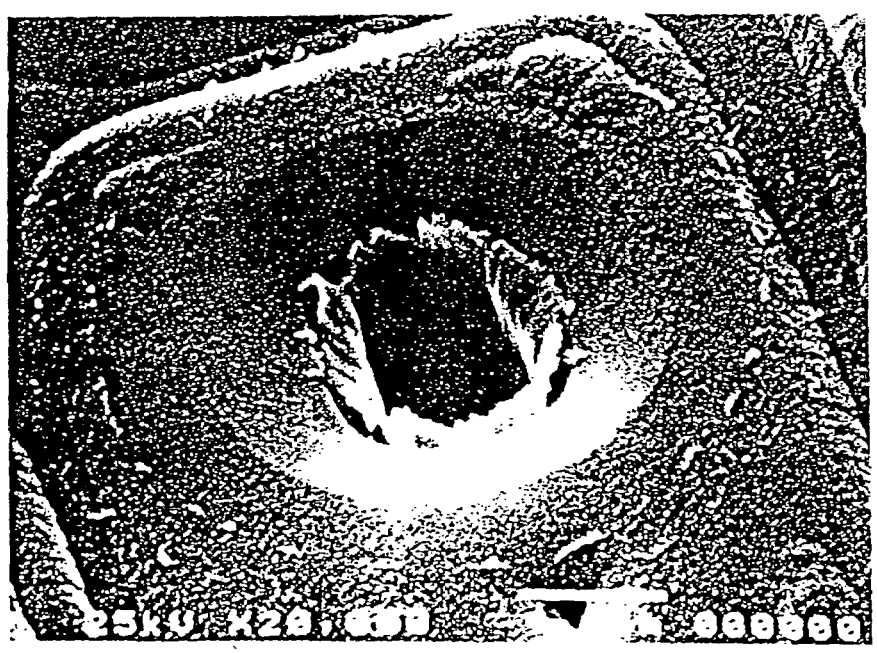

Example 3 illustrates the results of a comparison test between Composition F of the present invention as described above and the stripping composition described in U.S. Pat. No. 4,403,029 and sold under the name PRS-2000 by J. T. Baker. The results of the comparison test are shown with respect to an opening having the size of 1.2 micron in FIGS. 3A and 3B. Each opening was present on a silicon oxide dielectric layer which was etched using a standard silicon oxide plasma etching process. The photo-resist was removed from the layer following etching by oxygen plasma ashing. The substrate was then processed by immersing the substrate in Composition F as described above for 10 minutes at 65° C. A micrograph from a scanning microscope as shown in FIG. 3A indicates that Composition F removed all the organometallic residue. As shown in FIG. 3B, residue remained on the substrate when an etched wafer prepared under the same process conditions was processed by immersion in PRS-2000 for 10 minutes at 65° C.

Example 4

Example 4 illustrates the results of a comparison test between Composition C as described above and a stripping composition as described in U.S. Pat. No. 4,770,713 and sold under the name ACT-1501. ACT-1501 is a dimethylacetamide solvent based photoresist stripper.

Figure 4A:
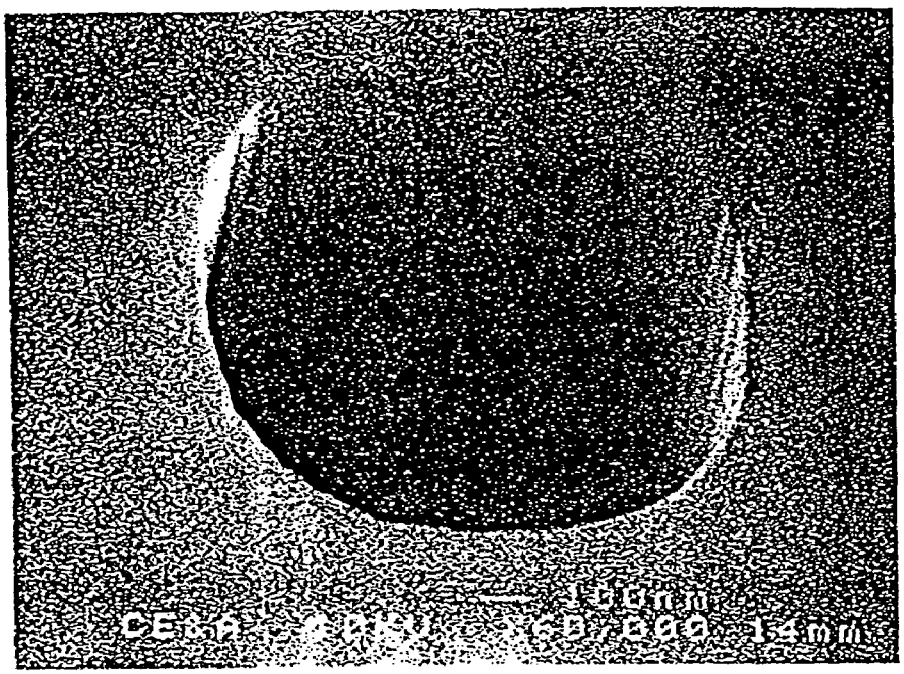
FIGS. 4A and 4B show the results of a comparison test utilizing a cleaning composition of the present invention (FIG. 4A) and a stripping composition as described in U.S. Pat. No. 4,770,713 (FIG. 4B) in relation to a silicon dielectric layer which contained etching residue following removal of a resist therefrom by plasma ashing. As evident upon a comparison of FIG. 4A with FIG. 4B, the composition of the present invention removed all the organometallic residue while the other composition did not.
Figure 4B:
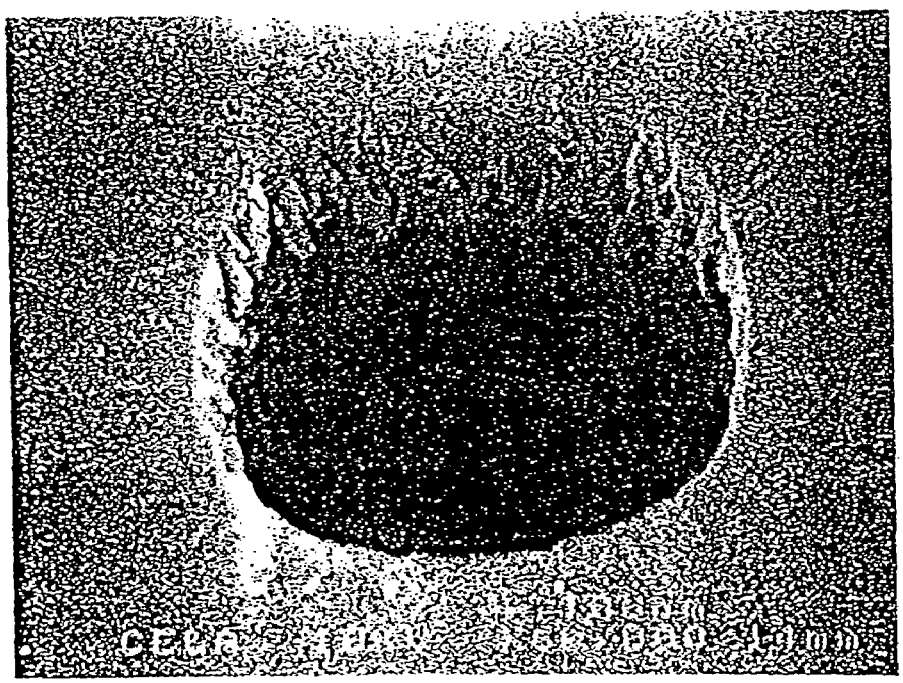

The comparison test results are shown in FIGS. 4A and 4B with respect to openings having a size of 1.0 micron. Each opening was present on a silicon oxide dielectric layer which was etched using a standard silicon oxide plasma etching process. The photoresist was removed by oxygen plasma ashing. The substrate was then processed by immersion in Composition C as described above for 30 minutes at 45° C. A micrograph from a scanning electron microscope as shown in FIG. 4A shows that Composition C completely removed all the organometallic residue without damaging the silicon oxide substrate. FIG. 4B shows a substrate prepared under the same process conditions after immersion in ACT-1501 for 30 minutes at 45° C. As shown in FIG. 4B, the stripping composition only partially removed the etching residue.

Example 5

Figure 5A:
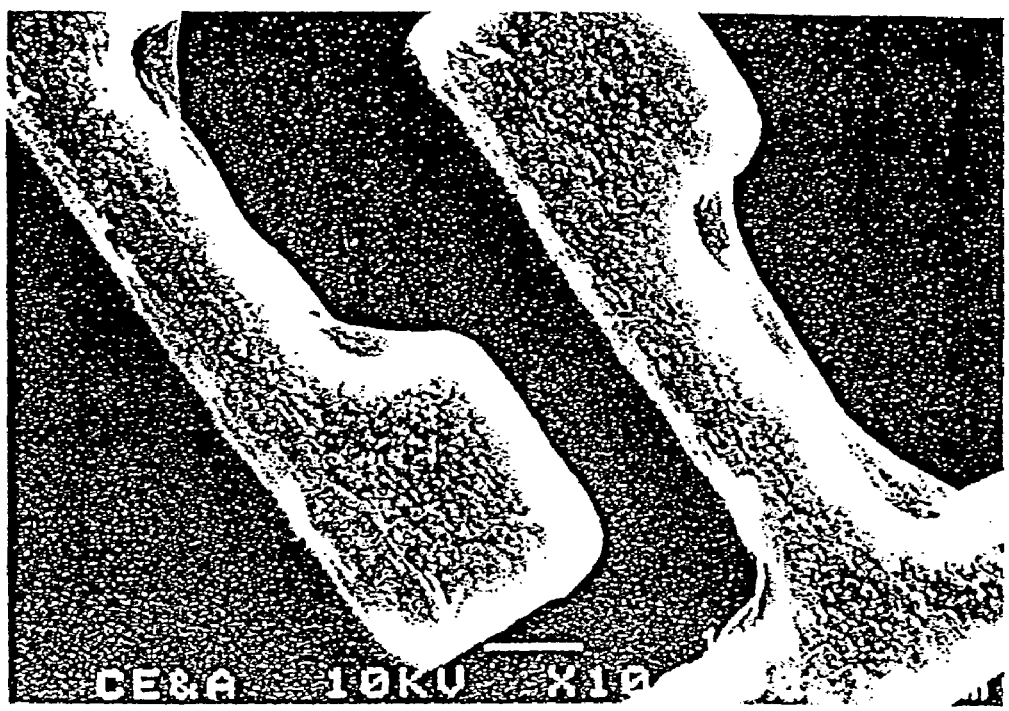
FIG. 5A shows a microcircuit pattern of polysilicon over silicon oxide containing etching residue which remained on the substrate following plasma etching.
Figure 5B:
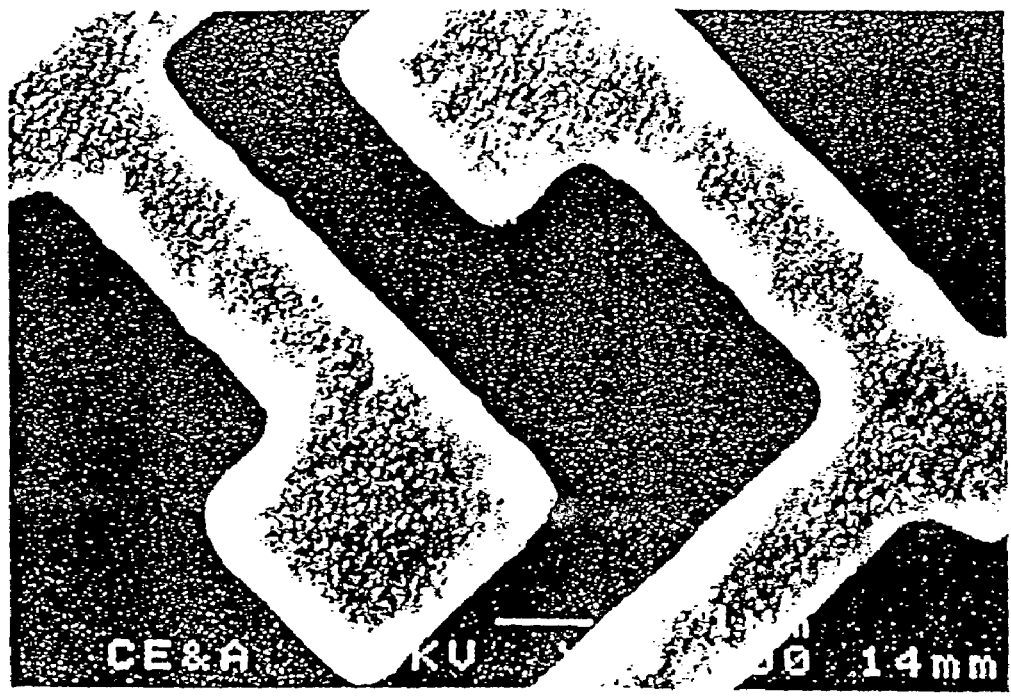
FIG. 5B shows the same microcircuit pattern following cleaning with a composition of the present invention. As evident from a comparison of FIG. 5A with FIG. 5B, it can be seen that the residue has been removed.

Example 5 illustrates the cleaning of polysilicon etching residue. A microcircuit pattern of polysilicon over silicon oxide was etched in plasma etching equipment using HBr as an etching gas. The photoresist was removed by oxygen plasma ashing. The etching residue, which is mostly SiC—Br, is shown in FIG. 5A to remain on the polysilicon circuit line following the removal of the photoresist. When the wafer was further processed by immersion in Composition C of the present invention at 65° C. for 20 minutes, all of the etching residue was removed from the substrate as shown in FIG. 5B.

Example 6

Figure 6A:
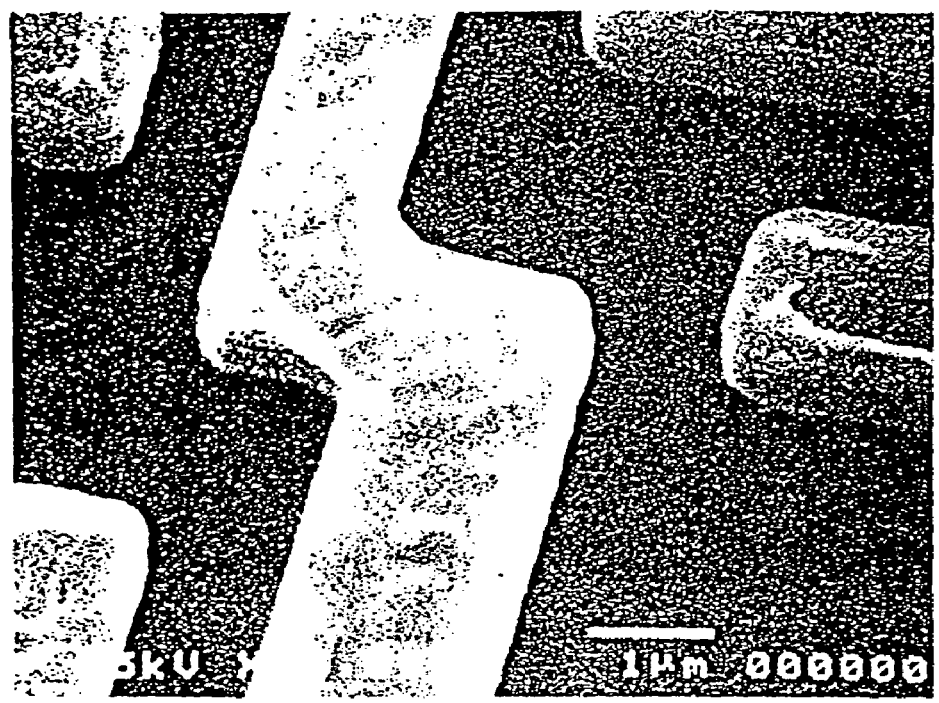
FIG. 6A shows residue which remained on a metal substrate after the removal of a photoresist from the substrate by plasma ashing.
Figure 6B:
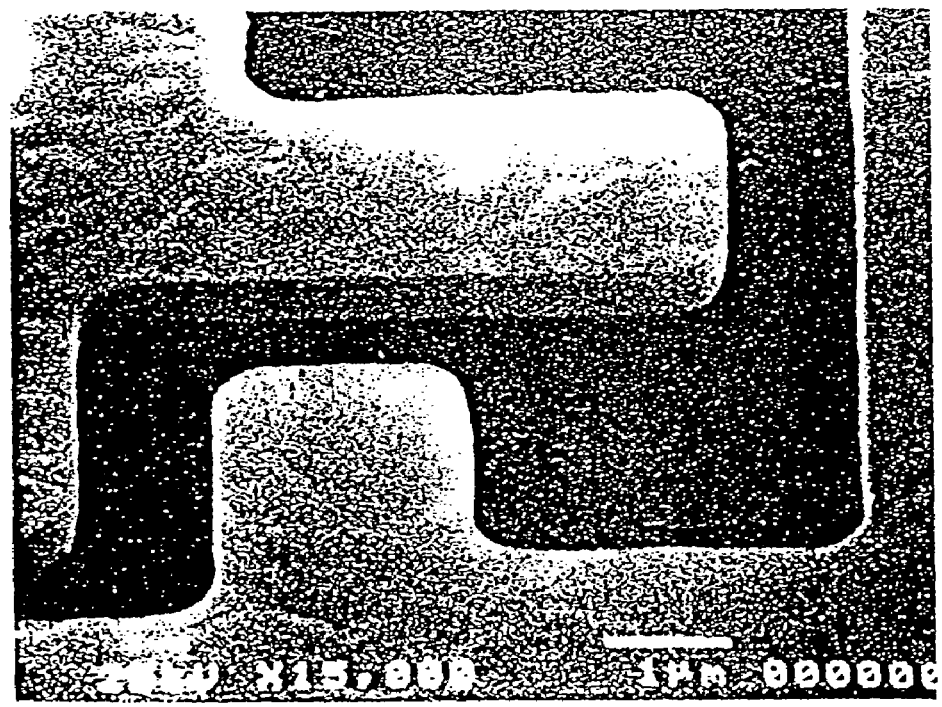
FIG. 6B shows the same substrate following cleaning with a composition of the present invention.

Example 6 illustrates the cleaning of a metal etch residue from a substrate. A sandwich metal substrate of TiW/Al—Si—Cu/TiW was patterned and etched in a plasma metal etcher, e.g., Applied Material 8330 Metal Etcher. This metal etcher is a batch etching equipment and therefore is capable of treating more than one wafer at a time. Due to the manner of etching performed by such etching equipment, a lesser amount of "polymer" residue is built-up during etching. As shown in FIG. 6A, residue remained on the metal line after the photoresist was removed by oxygen plasma ashing. The wafer was then processed by immersion in Composition B as described above at 65° C. for 30 minutes. As shown in FIG. 6B, Composition B served to remove all the organometallic residue from the surface.

Example 7

Example 7 illustrates the cleaning of a submicron circuit by means of via holes or openings, e.g., the holes on openings in the dielectric covering layer on a substrate which allow access to conductive material ofl the substrate, having a size of 0.6 microns on a silicon oxide dielectric layer which had been etched using a standard silicon oxide plasma etching processing. In particular, an oxide etcher as sold by Lam Research was utilized. In this process, the etching residue is mostly silicon containing polymer with a small ratio of metal in the composition. The underlying layer was a metal substrate of TiN/Al—Si—Cu. The photo-resist masking material was removed by oxygen plasma ashing. The substrate was then processed by immersion in Composition A as described above for 30 minutes at 60° C. A cross-section micrograph from a scanning microscope as shown in FIG. 7A indicates that Composition A removed all the organometallic residue. As shown in FIG. 7B, however, residue remained inside the opening when an etched wafer processed in the same conditions was treated in N-methyl-2-pyrrolidone solvent/alkanolamine based stripper for 60 minutes at 90° C. in an ultrasonic bath.

Example 8

Portions of silicon oxide etching equipment which are made of heavy gauge aluminum were removed from the etching equipment for cleaning. The conventional procedure utilized to remove the deposited outgas residue on the etching equipment is by sandblasting. Sandblasting, however, is a time consuming procedure. It has been found that the residue deposited on the aluminum portion of the etching equipment can be easily removed by immersion in a composition of the present invention. An aluminum portion of etching equipment was immersed in Composition E for 30 minutes at 40° C. Following rinsing and drying, it was observed that the residue was removed.

Example 9

The conventional process of cleaning a ceramic ring which forms a part of metal etching equipment involves either sandblasting or scrubbing by hand. Composition A was utilized to clean such ceramic ring by immersing the ceramic ring in an ultrasonic bath for 45 minutes at 35° C. It was found that the deposits on the ceramic ring were completely removed.

Example 10

Example 10 illustrates the cleaning of metal etch residue. An Al—Si—Cu/W/TiW metal pattern sitting on a plasma enhanced TEOS was utilized. The wafer had 50% overetching. P-5000 as sold by Applied Material was used for the metal etching. The P-5000 is a single wafer etcher and due to the processing technique of the etching equipment, a higher build-up of polymer remains following the etching which is more difficult to remove than that described in Examples 6 and 7 above. A sandwich metal substrate of Al—Si—Cu/W/TiW was patterned and etched in the plasma metal etcher P-5000. The small amount of residue left on the corner of the metal line after the photoresist was removed by oxygen plasma ashing and was cleaned using Composition B at 65° C. for 30 minutes. Such cleaned substrate is shown in FIG. 8A. Composition B did not provide for complete removal of the residue. A similar etched wafer was then processed by immersion in Composition D as described above at 65° C. for 30 minutes. As shown in FIG. 8B, Composition D removed all the organometallic residue from the surface. Composition B does not contain a corrosion inhibitor and Composition D contains a corrosion inhibitor. It is surmised that the activity of Composition B had begun to decrease due to its short term effectiveness based on the absence of a corrosion inhibitor.

Example 11

Example 11 illustrates that cleaning solutions containing corrosion inhibitors have increased stability as compared to the cleaning solutions not containing corrosion inhibitors. Compositions A, C and G, as described in Table I, were each placed in separate sealed Pyrex flasks and maintained at room temperature for a period of 80 days. A sample was taken from each flask at regular intervals and analyzed to determine its activity. The activity of the cleaning compositions is measured by the reduction potential of the hydroxylamine. It can be seen from FIG. 9 that Compositions G and A, which does not contain a corrosion inhibitor, lost their activity much faster than Composition C.

Examples 12–25 below are further illustrative of cleaning solutions prepared in accordance with the present invention. Examples 12–20 describe cleaning solutions having long term effectiveness due to the inclusion cif catechol or dihydroxybenzene as a corrosion inhibitor. Examples 21–25 are illustrative of cleaning solutions which do not contain a corrosion inhibitor and therefore have short term effectiveness.

The procedure utilized with respect to Examples 12–25 involved mixing the composition components together followed by heating of the mixture to 65° C. Wafer samples were then immersed in the cleaning solution for 30 minutes with infrequent agitation. The wafer samples were then placed in a N-methyl-2-pyrrolidinone bath having a temperature of 80–85° C. for 10 minutes. Thereafter, the wafer samples were rinsed in a water bath. In some of the Examples, the cleaning solution was subsequently diluted by the addition of 20 parts water and fresh wafer samples processed therein utilizing the same procedure for comparative purposes. The dried wafers were evaluated by an SEM spectrometer.

As used in the Examples, "DGA" stands for diglycolamine which is also known as 2-amino-2-ethoxy ethanol, "DMSO" stands for dimethylsulfoxide, and catechol is 1,2-dihydroxybenzene.

Example 12

A cleaning solution including 35 parts hydroxylamine (50% aqueous), 27 parts DGA, 5 parts catechol and 33 parts DMSO was prepared and utilized to clean a wafer. The wafer had a polysilicon structure and was completely cleaned with no damage to the structure by the cleaning solution. Wafers containing via holes also were cleaned of plasma etching residue.

The cleaning solution was thereafter diluted with 20 parts water and fresh wafer samples cleaned utilizing the solution. The additional water did not reduce the ability of the solution to clean polysilicon structures. The etching residue was satisfactorily removed from the wafer samples.

Example 13

A cleaning solution containing 34 parts hydroxylamine (50% aqueous), 5 parts catechol, 54 parts N-methyl-2-pyrrolidinone and 7 parts tetramethylammonium hydroxide (25% aqueous) was prepared and utilized to clean wafers having a metal structure. The wafers were cleaned of etching residue leaving no evidence of corrosion.

Thereafter, the cleaning solution was diluted with 20 parts water. Via holes in the wafers were cleaned with the diluted solution leaving no evidence of undercutting the substrate.

Example 14

A cleaning solution was prepared containing 35 parts hydroxylamine (50% aqueous), 59 parts DGA, 5 parts t-butylcatechol and 1 part water. The solution was utilized to clean wafers having a polysilicon structure. The wafers were cleaned without pitting of the substrate.

Thereafter, 20 parts water was added to the cleaning solution. The diluted solution was utilized to clean fresh wafer samples. The dilution of the cleaning solution did not diminish the cleaning effect of the solution on polysilicon structures. Each of the solutions of Example 18 were satisfactorily effective on via holes with no evidence of undercutting of the wafer substrate.

Example 15

A cleaning solution was prepared containing 35 parts hydroxylamine (50% aqueous), 45 parts DGA, 5 parts catechol and 15 parts tetramethylammonium hydroxide (25% aqueous). The cleaning solution provided good cleaning of polysilicon structures with no pitting of the substrate.

Example 16

A cleaning solution was prepared containing 60 parts DGA, 5 parts catechol and 35 parts N,N-dimethylhydroxylamine (50% aqueous). The cleaning solution provided good cleaning of polysilicon structures and showed very satisfactory results in the cleaning of via holes.

Thereafter, the cleaning solution was diluted with 20 parts water and utilized to clean fresh wafers. Dilution of the cleaning solution did not diminish the cleaning ability of the solution.

Example 17

A cleaning solution was prepared containing 51 parts DGA, 5 parts catechol, 31 parts methoxylamine hydrochloride and 13 parts water. The cleaning solution cleaned metal structures leaving no corrosion on the structures.

Subsequently, when 20 parts water was added to the cleaning solution to dilute the solution, the diluted solution was found to clean polysilicon and via hole features with no apparent corrosion of the metal structure.

Example 18

A cleaning solution containing 60 parts DGA, 5 parts catechol and 35 parts N,N-diethylhydroxylamine was prepared. The cleaning solution cleaned metal structures with no apparent corrosion of the structures.

When the cleaning solution was diluted with 20 parts water, the solution adequately cleaned via holes and metal structures.

Example 19

A cleaning solution was prepared containing 61 parts DGA, 5 parts catechol and 34 parts acetohydroxamic acid. The cleaning solution provided acceptable polysilicon wafer cleaning.

Subsequent dilution of the cleaning solution with 20 parts water did not affect the ability of the solution to clean via hole structures in wafers.

Example 20

A cleaning solution was prepared containing 60 parts DGA, 5 parts catechol, and 35 parts methylhydrazine. The cleaning solution provided good results in cleaning wafer via holes.

Subsequent dilution of the cleaning solution with 20 parts water did not significantly diminish the solution's ability to clean via holes having plasma etch residues thereon.

Example 21

A cleaning solution containing 49 parts DGA, 4 parts catechol, 29 parts methylhydrazinocarboxylate, and 18 parts water was prepared. The cleaning solution was effective for cleaning polysilicon and via hole structures.

Example 22

A cleaning solution having short term effectiveness was prepared containing 35 parts hydroxylamine (50% aqueous), 60 parts DGA and 5 parts dimethylgloxime. The cleaning solution, when used just subsequent to its preparation, provided acceptable results for cleaning via holes.

When 18 parts water was subsequently added to the cleaning solution, via holes were still effectively cleaned of plasma etch residue by the diluted solution.

Example 23

A cleaning solution containing 60 parts DGA and 40 parts N,N-dimethylhydroxylamine (50% aqueous) was prepared. When utilized immediately following preparation of the solution, the cleaning solution cleaned polysilicon structures with no problem.

Example 24

A cleaning solution containing 53 parts DGA, 33 parts N-methylhydroxylamine hydrochloride and 14 parts water was prepared. The cleaning solution, when used immediately following preparation of the solution, cleaned polysilicon structures and via holes with no detrimental effect.

Example 25

A cleaning solution was prepared containing 60 parts DGA and 20 parts N,N-diethylhydroxylamine and 20 parts water. The cleaning solution cleaned polysilicon structures with no corrosion resulting when the solution was utilized immediately following its preparation.

Example 26

A cleaning solution was prepared containing 60 parts DGA, and 40 parts hydroxylamine (50% aqueous). The cleaning solution adequately cleaned polysilicon structures, via holes and metal structures. However, after approximately one week, the solution lost its effectiveness although the composition had not changed. Five parts catechol were then added to the solution and the solution reactivated. The reactivated solution was able to again clean wafer structures, including via holes.

Upon diluting the reactivated cleaning solution with 18 parts water, the cleaning ability of the solution was found to be undiminished.

Examples 27–28

Comparative Examples 1 and 2 are prior art residue-removing formulations for semiconductor substrates, or metal/metal alloy layers thereon. Their relative compositions, with components listed in terms of percent by weight of the compositions, are shown below in Table IV. Examples 27–28 are residue-removing compositions according to the invention, in which the hydroxylamine component of Comparative Examples 1 and 2, respectively, is replaced with an equivalent amount (in terms of wt %) of a hydroxylamine derivative according to the invention. Table V below shows a comparison of the relative aggressiveness toward copper, aluminum, titanium, and tungsten substrates, in terms of total etch and etch rate at 70° C. after about 30 minutes exposure to Example 27 and Comparative Example 1. After exposure, the substrates were rinsed in deionized water for about 3 minutes and then dried using nitrogen gas.

TABLE IV

| Ingredient | Example 27 | Comparative Example 1 | Comparative Example 2 | Example 28 |
|---|---|---|---|---|
| Propylene glycol | | | 9.5 | 9.5 |
| $H_2O$ | 17.5 | 17.5 | 20.5 | 20.5 |
| MEA | | | 25 | 25 |
| DGA | 60 | 60 | 30 | 30 |
| HA | | 17.5 | 10 | |
| DEHA | 17.5 | | | 10 |
| Catechol | 5 | 5 | 5 | 5 |

TABLE V

| Composition + substrate* | Process Conditions | Thickness (Å) Before ($T_B$) | Thickness (Å) After ($T_A$) | ΔT ($T_B - T_A$) | Etch Rate (Å/min) |
|---|---|---|---|---|---|
| Example 27 + Cu | 70° C./30 min. | 15,147 | 15,169 | 0 | no loss |
| Example 27 + Al | | 8,467 | 8,488 | 0 | no loss |
| Example 27 + Ti | | 972 | 970 | 2 | 0.07 |
| Example 27 + W | | 9,875 | 9,869 | 6 | 0.2 |
| Comp. Ex. 1 + Cu | 70° C./30 min. | 14,994 | 250 | 14,744 | 490 |
| Comp. Ex. 1 + Al | | 8,635 | 8,373 | 262 | 8.7 |
| Comp. Ex. 1 + Ti | | 992 | 814 | 178 | 5.9 |
| Comp. Ex. 1 + W | | 9,759 | 9,737 | 22 | 0.73 |

*substrate: Cu (commercially available from Sematech EP; thickness ~15,000 Å)
Al (commercially available as Al/0.5% Cu from IWS; thickness ~10,000 Å)
Ti (commercially available from IWS; thickness ~1,000 Å)
W (commercially available from IWS as coating on Ti; thickness ~10,000 Å W atop ~100 Å Ti)

The composition of Example 27 performed better (i.e., exhibited a reduced etch rate) than that of Comparative Example 1 for every metal layer, but most notably for copper. The relative performances of various DEHA compositions on Cu, Al, and Ti substrates can been seen on three-dimensional graphical representations in FIGS. 10, 11, and 12, respectively.

Examples 29–33

Comparative Example 3 is a prior art residue-removing formulation for semiconductor substrates, or metal/metal alloy layers thereon. Its relative composition, with components listed in terms of percent by weight of the composition, is shown below in Table VI. Example 29 is a residue-removing composition according to the invention, in which the hydroxylamine component of Comparative Example 3 is replaced with an equivalent amount (in terms of wt %) of a hydroxylamine derivative according to the invention. Examples 29A, 30A–J, 31A–I, 32A–I, and 33A–I are different residue-removing compositions according to the invention, which contain the hydroxylamine derivative N,N-diethylhydroxylamine (DEHA) and which are substantially free of hydroxylamine. The relative compositions of each of these Examples, with components listed in terms of percent by weight of the composition, are also shown in Table VI below.

Table VII below shows a comparison of the relative aggressiveness toward copper, aluminum, and titanium substrates, in terms of a cleaning and corrosion rating (1–10 scale; 10 being clean/corrosion-free, 1 being completely unclean/severely corroded) at about 65° C. after about 20 minutes exposure to Examples 30A, 30D, 30F, 30I, 30J, 31A, 31D, 31G, 33A, 33D, and 33G. After exposure, the substrates were rinsed in deionized water for about 3 minutes and then dried using nitrogen gas. Table VIII below shows a comparison of the relative aggressiveness toward copper, aluminum, and titanium substrates, in terms of a metal etch rate at 65° C. after about 30 minutes exposure to Comparative Example 3 and Examples 29, 29A, 30A, 30B, 30D, 30F, 30I, 30J, 31A, 31D, 31G, 32D, 33A, 33D, and 33G. After exposure, the substrates were rinsed in deionized water for about 5 minutes and dried using nitrogen gas.

TABLE VI

| Formula # | DEHA | $H_2O$ | Gallic Acid | DGA |
|---|---|---|---|---|
| Comp. Ex. 3 | 13 (HA) | 30.5 | 8.5 | 48 |
| Example 29 | 13 | 30.5 | 8.5 | 48 |
| Example 29A | 13 | 30.5 | 0 | 56.5 |
| Example 30A | 13 | 30.5 | 2.5 | 54 |
| Example 30B | 13 | 30.5 | 5 | 51.5 |
| Example 30C | 13 | 20 | 8.5 | 58.5 |
| Example 30D | 13 | 20 | 2.5 | 48 |
| Example 30E | 13 | 20 | 5 | 62 |
| Example 30F | 13 | 40 | 2.5 | 44.5 |
| Example 30G | 13 | 40 | 5 | 42 |
| Example 30H | 13 | 40 | 8.5 | 38.5 |
| Example 30I | 13 | 25 | 2.5 | 59.5 |
| Example 30J | 13 | 35 | 2.5 | 49.5 |
| Example 31A | 10 | 20 | 2.5 | 67.5 |
| Example 31B | 10 | 20 | 5 | 65 |
| Example 31C | 10 | 20 | 8.5 | 61.5 |
| Example 31D | 10 | 30 | 2.5 | 57 |

TABLE VI-continued

| Formula # | DEHA | H₂O | Gallic Acid | DGA |
|---|---|---|---|---|
| Example 31E | 10 | 30 | 5 | 54.5 |
| Example 31F | 10 | 30 | 8.5 | 51 |
| Example 31G | 10 | 40 | 2.5 | 47.5 |
| Example 31H | 10 | 40 | 5 | 45 |
| Example 31I | 10 | 40 | 8.5 | 41.5 |
| Example 32A | 16 | 20 | 2.5 | 61.5 |
| Example 32B | 16 | 20 | 5 | 59 |
| Example 32C | 16 | 20 | 8.5 | 55.5 |
| Example 32D | 16 | 30.5 | 2.5 | 51 |
| Example 32E | 16 | 30.5 | 5 | 48.5 |
| Example 32F | 16 | 30.5 | 8.5 | 45 |
| Example 32G | 16 | 40 | 2.5 | 41.5 |
| Example 32H | 16 | 40 | 5 | 39 |
| Example 32I | 16 | 40 | 2.5 | 38.5 |
| Example 33A | 20 | 20 | 2.5 | 57.5 |
| Example 33B | 20 | 20 | 5 | 55 |
| Example 33C | 20 | 20 | 8.5 | 51.5 |
| Example 33D | 20 | 30.5 | 2.5 | 47 |
| Example 33E | 20 | 30.5 | 5 | 44.5 |
| Example 33F | 20 | 30.5 | 8.5 | 41 |
| Example 33G | 20 | 40 | 2.5 | 37.5 |
| Example 33H | 20 | 40 | 5 | 35 |
| Example 33I | 20 | 40 | 8.5 | 31.5 |

TABLE VII

| Examples w/2.5% GA | wt % DEHA | wt % H₂O | Rating (clean, corrosion) of commercial substrate from: Sematech | Silterra M5 | National Via |
|---|---|---|---|---|---|
| 31A | 10 | 20 | clean (10, 9.5) | not clean (8, 9.5) | clean (9, 10) |
| 31D | 10 | 30.5 | clean (9.8, 10) | corrosion (9.5, 8) | clean (9, 10) |
| 31G | 10 | 40 | corrosion (10, 8) | corrosion (10, 5) | not clean (8, 9) |
| 30D | 13 | 20 | clean (10, 9.5) | not clean (8, 10) | not clean (7, 10) |
| 30I | 13 | 25 | clean (9, 9) | not clean (8, 9) | clean (9, 10) |
| 30A | 13 | 30.5 | clean (10, 10) | clean (10, 10) | not clean (8, 10) |
| 30J | 13 | 35 | corrosion (10, 7) | corrosion (9, 6) | not clean (6, 10) |
| 30F | 13 | 40 | corrosion (9.5, 8) | corrosion (10, 7) | clean (9, 10) |
| 33A | 20 | 20 | clean (9.5, 10) | clean (10, 9.5) | not clean (8, 10) |
| 33D | 20 | 30.5 | corrosion (9, 8) | corrosion (9, 8) | not clean (8, 10) |
| 33G | 20 | 40 | corrosion (10, 6) | corrosion (10, 6) | not clean (8, 10) |

TABLE VIII

| Example # | wt % DEHA | wt % H₂O | wt % GA | Etch Rate (Å/min) Cu | Al | Ti |
|---|---|---|---|---|---|---|
| 31A | 10 | 20 | 2.5 | 9.4 | 2.6 | 0.4 |
| 31D | 10 | 30.5 | 2.5 | 10.5 | 11.2 | 0.0 |
| 31G | 10 | 40 | 2.5 | 4.0 | 20.8 | no loss |
| 29A | 13 | 30.5 | 0 | 13.4 | 12.0 | 0.4 |
| 30D | 13 | 20 | 2.5 | 15.0 | 2.0 | no loss |
| 30I | 13 | 25 | 2.5 | 8.6 | 2.5 | no loss |
| 30A | 13 | 30.5 | 2.5 | 10.4 | 0.6 | 0.0 |
| 30J | 13 | 35 | 2.5 | 2.2 | 5.0 | 0.0 |
| 30F | 13 | 40 | 2.5 | 2.9 | 59.4 | 0.1 |
| 30B | 13 | 30.5 | 5 | 13.3 | 0.1 | 0.2 |
| 29 | 13 | 30.5 | 8.5 | 0.6 | 18.8 | no loss |
| Comparative Example 3 | 13 (HA) | 30.5 | 8.5 | >500 | 2.3 | no loss |
| 32D | 16 | 30.5 | 2.5 | 2.8 | 0.6 | 0.1 |
| 33A | 20 | 20 | 2.5 | 39 | 1.8 | 0.1 |
| 33D | 20 | 30.5 | 2.5 | 4.3 | 5.3 | 0.0 |
| 33G | 20 | 40 | 2.5 | 2.4 | 38.3 | 3.7 |

Based on data shown in Tables IV, V, and VII above, several generalizations can be made about the compositions according to the invention.

When the substrate has a titanium layer, the above compositions can advantageously contain, in one embodiment: a two-carbon atom linkage alkanolamine compound content (e.g., a DGA content) of at least about 40% by weight, alternately from about 40% to about 80% by weight; a hydroxylamine derivative content (e.g., a DEHA content) from about 1% to about 30% by weight, alternately from about 5% to about 25% by weight; and a corrosion inhibitor content (e.g., a gallic acid or catechol content, or a combination thereof) from about 0.1% to about 15% by weight, alternately from about 2% to about 10% by weight; a water content from 0% to about 50% by weight, alternately from about 10% to about 40% by weight, in order for the composition to exhibit an acceptably low etch rate.

When the substrate has a titanium layer, the above compositions can advantageously contain, in an alternate embodiment: a water content from about 0% to about 39% by weight, alternately from about 10% to about 39% by weight; a hydroxylamine derivative content (e.g., a DEHA content) from about 1% to about 19% by weight, alternately from about 5% to about 19% by weight; a two-carbon atom linkage alkanolamine compound content (e.g., a DGA content) from about 20% to about 80% by weight, alternately from about 30% to about 70% by weight; and a corrosion inhibitor content (e.g., a gallic acid or catechol content, or a combination thereof) from about 0.1% to about 15% by weight, alternately from about 2% to about 10% by weight, in order for the composition to exhibit an acceptably low etch rate.

When the substrate has a copper layer, the above compositions can advantageously contain, in one embodiment: a two-carbon atom linkage alkanolamine compound content (e.g., a DGA content) of not more than 51.0% by weight, alternately from about 20% to 51.0% by weight; a hydroxylamine derivative (e.g., DEHA) from about 1% to about 30% by weight, alternately from about 5% to about 25% by weight; a water content from 0% to about 50% by weight, alternately from about 10% to about 40% by weight; and a corrosion inhibitor content (e.g., a gallic acid or catechol content, or a combination thereof) from about 0.1% to about 15% by weight, alternately from about 2% to about 10% by weight, as well as being substantially (or completely) free from hydroxylamine, in order for the composition to exhibit an acceptably low etch rate.

When the substrate has a copper layer, the above compositions can advantageously contain, in an alternate embodiment: a corrosion inhibitor content (e.g., a gallic acid or catechol content, or a combination thereof) from about 6% to about 15% by weight, alternately from about 6% to about 10% by weight; a water content from 0% to about 50% by weight, alternately from about 10% to about 40% by weight; a hydroxylamine derivative (e.g., DEHA) from about 1% to about 30% by weight, alternately from about 5% to about 25% by weight; and a two-carbon atom linkage alkanolamine compound content (e.g., a DGA content) from about 20% to about 80% by weight, alternately from about 30% to about 70% by weight, as well as being substantially (or preferably completely) free from hydroxylamine, in order for the composition to exhibit an acceptably low etch rate.

When the substrate has a copper layer, the above compositions can advantageously contain, in another alternate embodiment: a corrosion inhibitor content (e.g., a gallic acid or catechol content, or a combination thereof) of less than 5% by weight, alternately from about 1% to about 4% by weight; a water content from 0% to 31% by weight, alternately from about 10% to about 31% by weight; a two-carbon atom linkage alkanolamine compound content (e.g., a DGA content) from about 20% to about 80% by weight, alternately from about 30% to about 70% by weight; and a hydroxylamine derivative content (e.g., a DEHA content) from about 1% to about 15% by weight, alternately from about 8% to about 15% by weight, as well as being substantially (or preferably completely) free from hydroxylamine, in order for the composition to exhibit an acceptably low etch rate.

When the substrate has a copper layer, the above compositions can advantageously contain, in another alternate embodiment: a water content of greater than 25% by weight, alternately from about 26% to about 50% by weight; a hydroxylamine derivative content (e.g., a DEHA content) of greater than about 15% by weight, alternately from about 15% to about 30% by weight; a two-carbon atom linkage alkanolamine compound content (e.g., a DGA content) from about 20% to about 80% by weight, alternately from about 30% to about 70% by weight; and a corrosion inhibitor content (e.g., a gallic acid or catechol content, or a combination thereof) from about 0.1% to about 15% by weight, alternately from about 1% to about 10% by weight, as well as being substantially (or preferably completely) free from hydroxylamine, in order for the composition to exhibit an acceptably low etch rate.

When the substrate has an aluminum layer, the above compositions can advantageously contain, in one embodiment: a two-carbon atom linkage alkanolamine compound content (e.g., a DGA content) of not less than 50.0% by weight, alternately from about 10% to 50.0% by weight; a hydroxylamine derivative content (e.g., a DEHA content) of greater than about 11% by weight, alternately from about 11% to about 30% by weight; a water content from about 0% to about 50% by weight, alternately from about 10% to about 50% by weight; and a corrosion inhibitor content (e.g., a gallic acid or catechol content, or a combination thereof) from about 0.1% to about 15% by weight, alternately from about 1% to about 10% by weight, as well as being substantially (or preferably completely) free from hydroxylamine, in order for the composition to exhibit an acceptably low etch rate.

When the substrate has an aluminum layer, the above compositions can advantageously contain, in an alternate embodiment: a water content of less than about 30% by weight, alternately from about 5% to about 30% by weight; a two-carbon atom linkage alkanolamine compound content (e.g., a DGA content) from about 20% to about 80% by weight, alternately from about 30% to about 70% by weight; a corrosion inhibitor content (e.g., a gallic acid or catechol content, or a combination thereof) from about 0.1% to about 15% by weight, alternately from about 1% to about 10% by weight; and a hydroxylamine derivative content (e.g., a DEHA content) from about 1% to about 30% by weight, alternately from about 5% to about 25% by weight, as well as being substantially (or preferably completely) free from hydroxylamine, in order for the composition to exhibit an acceptably low etch rate.

When the substrate has an aluminum layer, the above compositions can advantageously contain, in another alternate embodiment: a corrosion inhibitor content (e.g., a gallic acid or catechol content, or a combination thereof) from about 0.5% to about 7% by weight, alternately from about 1% to about 6% by weight; a water content of less than 35% by weight, alternately from about 10% to about 50% by weight; a two-carbon atom linkage alkanolamine compound content (e.g., a DGA content) from about 20% to about 80% by weight, alternately from about 30% to about 70% by weight; and a hydroxylamine derivative content (e.g., a DEHA content) from about 11% to about 18% by weight, alternately from about 12% to about 17%, as well as being substantially (or preferably completely) free from hydroxylamine, in order for the composition to exhibit an acceptably low etch rate.

It should further be apparent to those skilled in the art that various changes in form and details of the invention as shown and described may be made. It is intended that such changes be included within the spirit and scope of the claims appended hereto. The above examples are exemplary, and the scope of the invention should be determined by the claims below and, in the event of continuations or divisionals of this application, by the claims therein.

What is claimed is:

1. A resist and etching residue remover composition comprising:

from about 1 wt % to about 30 wt % of N,N-diethylhydroxylamine from about 20 wt % to about 80 wt % of a two-carbon atom linkage alkanolamine compound having the formula

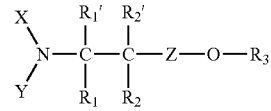

wherein $R_1$, $R_1'$, $R_2$, $R_2'$, and $R_3$ are, independently in each case, hydrogen or a linear, branched, or cyclic hydrocarbon containing from 1 to 7 carbon atoms, wherein Z is a group having the formula -(-Q-$CR_1R_1'$—$CR_2R_2'$—)$_m$—, such that m is a whole number from 0 to 3, $R_1$, $R_1'$, $R_2$, and $R_2'$ are independently defined in each repeat unit, if m>1, within the parameters set forth for these moieties above, and Q is independently defined in each repeat unit, if m>1, each Q being independently either —O— or —$NR_3$—, and wherein X and Y are, independently in each case, hydrogen, a $C_1$–$C_7$ linear, branched, or cyclic hydrocarbon, or a group having the formula —$CR_1R_1'$—$CR_2$ $R_2'$-Z-F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring, wherein the two-carbon atom linkage alkanolamine compound comprises 2-(2-aminoethylamino)-ethanol; and from about 0.1 wt % to about 15 wt % of a corrosion inhibitor which comprises gallic acid, catechol, or an ethylenediamine tetracarboxylic acid compound;

wherein the composition is substantially free of hydroxylamine and of fluoride ions, and the composition is capable of removing residue from a metal or metal alloy substrate or a metal or metal alloy substrate layer, while maintaining an acceptably low etch rate with respect to the metal or metal alloy substrate or substrate layer.

2. The composition of claim 1, further comprising water in an amount from about 5 wt % to about 40 wt %.

3. The composition of claim 1, wherein the composition is substantially free from water.

4. The composition of claim 1, further comprising a polar organic solvent in an amount from about 5 wt % to about 15 wt %.

5. The composition of claim 1, wherein the corrosion inhibitor comprises an ethylenediamine tetracarboxylic acid compound having the formula

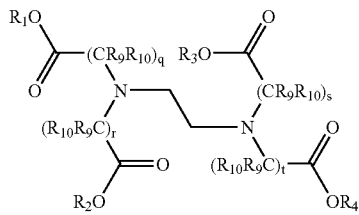

wherein $R_1$, $R_2$, $R_3$ and $R_4$ can be either H, or $NR_5R_6R_7R_8$, where $R_5$, $R_6$, $R_7$, and $R_8$ are each independently hydrogen or a linear or branched $C_1$–$C_6$ hydrocarbon, or where two or more of $R_5$, $R_6$, $R_7$, and $R_8$ together form a heterocyclic $C_4$–$C_7$ ring, wherein $R_9$ and $R_{10}$ may be independently defined in each repeat unit and each of which are independently hydrogen or a linear or branched $C_1$–$C_6$ hydrocarbon, and wherein each of q, r, s, and t is a whole number from 0 to 4.

6. The composition of claim 1, wherein the two-carbon atom linkage alkanolamine compound has a boiling point of at least about 185° C. and a flash point of at least about 95° C.

7. The composition of claim 1, wherein more than one two-carbon atom linkage alkanolamine compound is present in the composition.

8. The composition of claim 1, wherein the corrosion inhibitor comprises gallic acid or catechol, and wherein the two-carbon atom linkage alkanolamine compound comprises 2-(2-aminoethyoxy)-ethanol.

9. A resist and etching residue remover composition comprising:
from about 1 wt % to about 30 wt % of N,N-diethylhydroxylamine;
from about 20 wt % to about 80 wt % of a two-carbon atom linkage alkanolamine compound having the formula

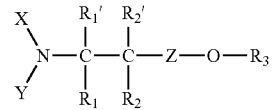

wherein $R_1$, $R_1'$, $R_2$, $R_2'$, and $R_3$ are, independently in each case, hydrogen or a linear, branched, or cyclic hydrocarbon containing from 1 to 7 carbon atoms, wherein Z is a group having the formula -(-Q-$CR_1R_1'$—$CR_2R_2'$-)m-, such that m is a whole number from 0 to 3, $R_1$, $R_1'$, $R_2$, and $R_2'$ are independently defined in each repeat unit, if m>1, within the parameters set forth for these moieties above, and Q is independently defined in each repeat unit, if m>1, each Q being independently either —O— or —$NR_3$—, and wherein X and Y are, independently in each case, hydrogen, a $C_1$–$C_7$ linear, branched, or cyclic hydrocarbon, or a group having the formula —$CR_1R_1'$—$CR_2R_2'$-Z-F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring wherein the two-carbon atom linkage alkanolamine compound comprises 2-(2-aminoethylamino)-ethanol; and from about 5 wt % to about 45 wt % water, wherein the composition is substantially free of polar organic solvents and of fluoride ions, and the composition is capable of removing residue from a metal or metal alloy substrate or a metal or metal alloy substrate layer, while maintaining an acceptably low etch rate with respect to the metal or metal alloy substrate or substrate layer.

10. The substantially polar organic solvent-free composition of claim 9, wherein the composition is substantially free from corrosion inhibitors.

11. The substantially polar organic solvent-free composition of claim 9, wherein the two-carbon atom linkage alkanolamine compound has a boiling point of at least about 185° C. and a flash point of at least about 95° C.

12. The substantially polar organic solvent-free composition of claim 9, wherein the two-carbon atom linkage alkanolamine compound is 2-(2-aminoethoxy)-ethanol.

13. The substantially polar organic solvent-free composition of claim 9, further comprising hydroxylamine, wherein the ratio of hydroxylamine derivative to hydroxylamine is from about 20:1 to about 1:20, by weight.

14. A resist and etching remover composition comprising:
from about 1 wt % to about 30 wt % of N,N-diethylhydroxylamine;
from about 20 wt % to about 80 wt % of a two-carbon atom linkage alkanolamine compound having the formula

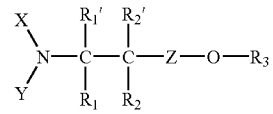

wherein $R_1$, $R_1'$, $R_2$, $R_2'$, and $R_3$ are, independently in each case, hydrogen or a linear, branched, or cyclic hydrocarbon containing from 1 to 7 carbon atoms, wherein Z is a group having the formula $-(-Q-CR_1R_{1'}-CR_2R_{2'}-)m-$, such that m is a whole number from 0 to 3, $R_1$, $R_{1'}$, $R_2$, and $R_{2'}$ are independently defined in each repeat unit, if m>1, within the parameters set forth for these moieties above, and Q is independently defined in each repeat unit, if m>1, each Q being independently either —O— or —$NR_3$—, and wherein X and Y are, independently in each case, hydrogen, a $C_1$–$C_7$ linear, branched, or cyclic hydrocarbon, or a group having the formula —$CR_1R_1'$—$CR_2 R_2'$-Z-F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring, wherein the two-carbon atom linkage alkanolamine compound comprises 2-(2-aminoethylamino)-ethanol; and from about 5 wt % to about 45 wt % water, wherein the composition is substantially free of hydroxylamine and of fluoride ions, and the composition is capable of removing residue from a metal or metal alloy substrate or a metal or metal alloy substrate layer, while maintaining an acceptably low etch rate with respect to the metal or metal alloy substrate or substrate layer.

15. The substantially hydroxylamine-free composition of claim 14, wherein the composition is substantially free from corrosion inhibitors.

16. The substantially hydroxylamine-free composition of claim 14, wherein the two-carbon atom linkage alkanolamine compound has a boiling point of at least about 185° C. and a flash point of at least about 95° C.

17. The substantially hydroxylamine-free composition of claim 16, wherein the two-carbon atom linkage alkanolamine compound is 2-(2-aminoethoxy)-ethanol, or both.

18. The substantially hydroxylamine-free composition of claim 14, further comprising a polar organic solvent in an amount from about 5 wt % to about 15 wt %.

19. The substantially hydroxylamine-free composition of claim 14, wherein the composition is substantially free from polar organic solvents.

20. A resist and etching residue remover composition comprising:

from about 5 wt % to about 30 wt % of N,N-diethylhydroxylamine; and from about 20 wt % to about 80 wt % of a two-carbon atom linkage alkanolamine compound having the formula

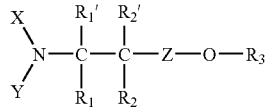

wherein $R_1$, $R_{1'}$, $R_2$, $R_{2'}$, and $R_3$ are, independently in each case, hydrogen or a linear, branched, or cyclic hydrocarbon containing from 1 to 7 carbon atoms, wherein Z is a group having the formula $-(-Q-CR_1R_{1'}-CR_2R_{2'})m-$, such that m is a whole number from 0 to 3, $R_1$, $R_{1'}$, $R_2$, and $R_{2'}$ are independently defined in each repeat unit, if m>1, within the parameters set forth for these moieties above, and Q is independently defined in each repeat unit, if m>1, each Q being independently either —O— or —$NR_3$—, and wherein X and Y are, independently in each case, hydrogen, a $C_1$–$C_7$ linear, branched, or cyclic hydrocarbon, or a group having the formula —$CR_1R_1$—$CR_2 R_{2'}$-Z-F, with F being either —O—$R_3$ or —$NR_3R_4$, where $R_4$ is defined similarly to $R_1$, $R_{1'}$, $R_2$, $R_{2'}$, and $R_3$ above, and with Z, $R_1$, $R_{1'}$, $R_2$, $R_{2'}$, and $R_3$ defined as above, or wherein X and Y are linked together form a nitrogen-containing heterocyclic $C_4$–$C_7$ ring, wherein the composition is substantially free of water and of fluoride ions, and the composition is capable of removing residue from a metal or metal alloy substrate or a metal or metal alloy substrate layer, while maintaining an acceptably low etch rate with respect to the metal or metal alloy substrate or substrate layer.

* * * * *